United States Patent [19]

Carter et al.

[11] Patent Number: 4,555,769

[45] Date of Patent: Nov. 26, 1985

[54] CIRCUIT APPARATUS FOR GENERATING MODULUS-N RESIDUES

[75] Inventors: Eric L. Carter, Endicott; Harold T. Ward, Vestal, both of N.Y.

[73] Assignee: International Business Machines Corporation, Armonk, N.Y.

[21] Appl. No.: 498,214

[22] Filed: May 25, 1983

[51] Int. Cl.[4] .............................................. G06F 7/72
[52] U.S. Cl. ............................. 364/746; 340/347 DD
[58] Field of Search .............................. 364/746, 739; 340/347 DD

[56] References Cited

U.S. PATENT DOCUMENTS

| 3,446,989 | 5/1969 | Allen et al. | 307/208 |
| 3,980,874 | 9/1976 | Vora | 364/746 |
| 4,190,893 | 2/1980 | Gajski | 364/746 |
| 4,274,017 | 6/1981 | Carter et al. | 307/289 |

FOREIGN PATENT DOCUMENTS 2405593  5/1979  France .

OTHER PUBLICATIONS

Weinberger, "Modulo-3 Residue Trees" *IBM Tech. Disclosure Bulletin,* vol. 19, No. 7, pp. 2657-2662, Dec. 1976.
"Modulo-3 Residue Tree", R. E. Goldschmidt et al., IBM Technical Disclosure Bulletin, vol. 8, No. 1, Jun. 1965, pp. 29-31.
"Error Detecting Logic for Digital Computers", F. F. Sellers, Jr. et al., McGraw-Hill Book Company, 1968, pp. 76-83, 130-132.
"High-Speed Look-Ahead Carry", E. J. Nosowicz et al., IBM Technical Disclosure Bulletin, vol. 20, No. 12, May 1978, pp. 5150-5151.
"Scale of Two Divider", C. S. K. Ng et al., IBM Technical Disclosure Bulletin, vol. 21, No. 9, Feb. 1979, pp. 3609-3611.
"Cascode Current Switch ALU", J. H. Underwood, IBM Technical Disclosure Bulletin, vol. 21, No. 12, May 1979, pp. 4808-4810.

*Primary Examiner*—David H. Malzahn
*Attorney, Agent, or Firm*—Norman R. Bardales

[57] ABSTRACT

A modular modulus-N residue circuit apparatus uses cascode logic networks in the modules for generating greater than one odd integer N residues.

11 Claims, 7 Drawing Figures

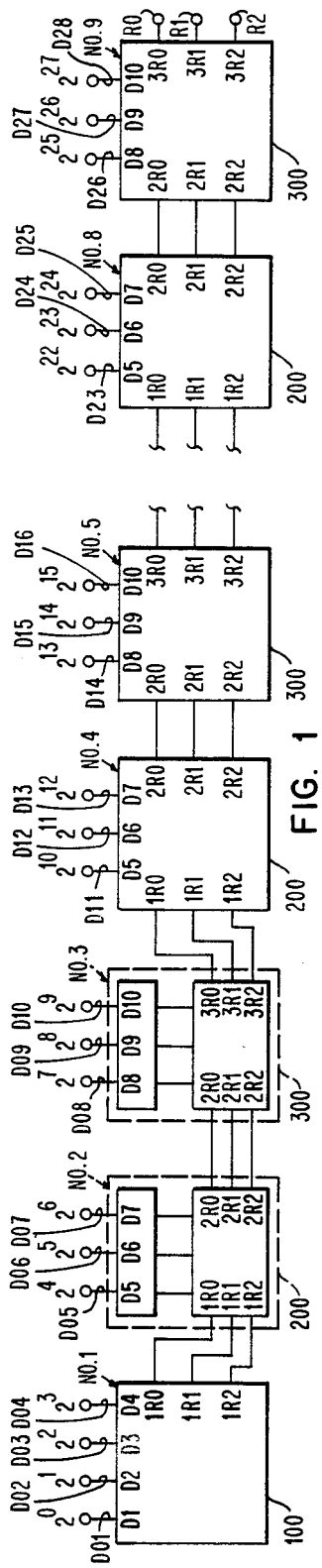
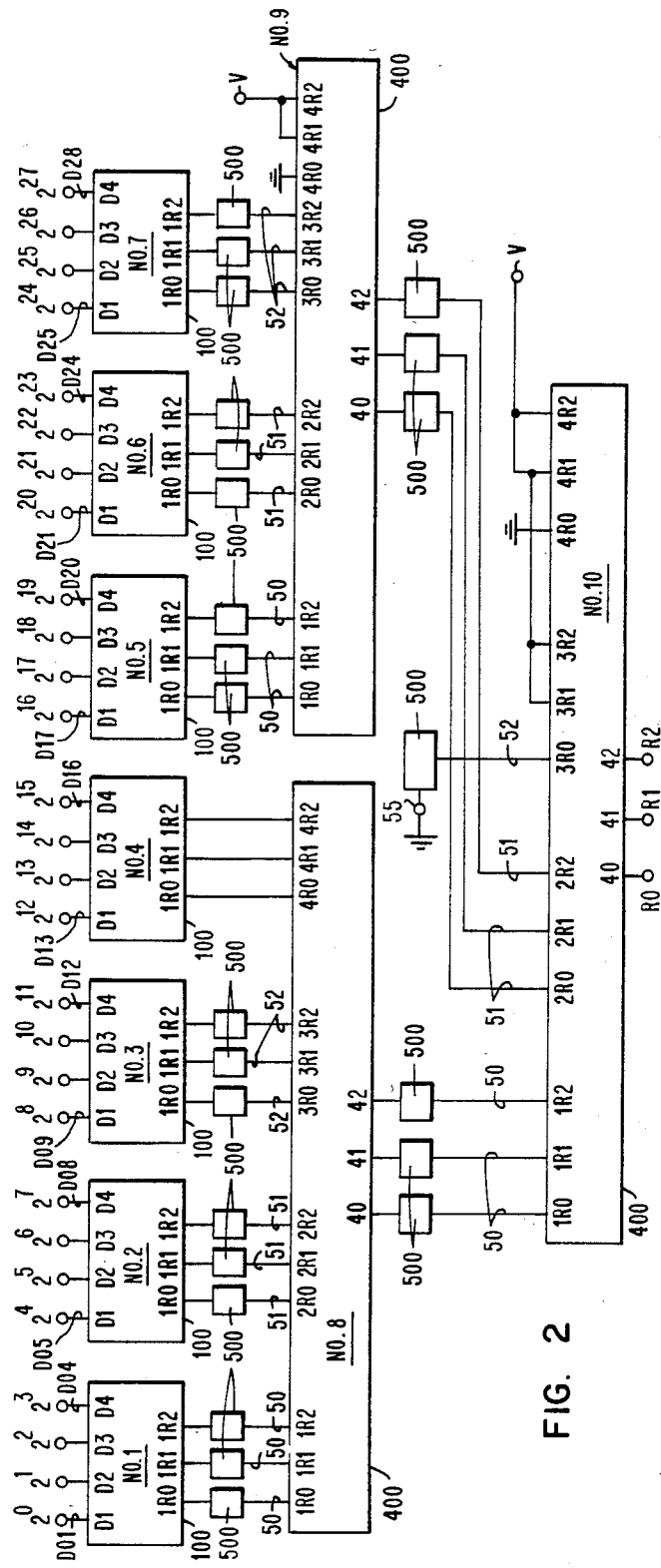
FIG. 1
FIG. 2

CIRCUIT APPARATUS FOR GENERATING MODULUS-N RESIDUES

BACKGROUND OF THE INVENTION

1. Field of the Invention

This invention relates to modulus-N residue generating circuit apparatus and more particular to circuit apparatus for generating modulus-N residues wherein N is an odd integer greater than one.

2. Description of the Prior Art

A modulus-N residue is the remainder obtained when an operand is divided by the number N. Thus, for modulus three, i.e. N=3, hereinafter referred to as modulus-3 or modulo-3 or simply mod-3, the three possible numerical values of the residues are 0, 1 and 2.

As is well known to those skilled in the art, modulus-N residues are often used as error detection codes. For example, in a modulo-3 check, which is also synonymous with residue check, an operand is divided by 3 to generate a remainder that is retained and later used for checking. If the remainder obtained when the operand is subsequently divided by 3 does not equal the retained value, an error is indicated. Residue checking logic circuits are used to detect arithmetic errors in digital computers. For example, multiplication of A and B can be checked using the following relationship:

Residue $(A \times B)$ = Residue $(A)$ × Residue $(B)$.

For further information regarding error detecting logic in general and mod-3 residue checking circuits in particular, the reader is referred to, for example, "Error Detecting Logic For Digital Computers", Frederick F. Sellers, Jr. et al, McGraw-Hill Book Company, 1968, pages 76–83, 130–132.

To generate the mod-N residues heretofore, the prior art required a significant number of logic circuit components and/or a corresponding complexity. For example, one known circuit to generate the mod-3 residue of a twenty-eight bit number required one-hundred and fifty-eight And/Invert circuits and twelve stages of delay, and hence a concomitant amount of circuitry and power. Even when implemented in large scale integrated circuit technology, such as LSI or VLSI, this represents a significant hardware and real estate investment.

A type of logic, which is sometimes referred to in the art as cascode logic or cascode current switch logic, works on the principle of current steering such as, for example, the circuits described in "Multiple Level Logic Circuit", U.S. Pat. No. 3,446,989 and "Cascode Polarity Hold Latch Having Integrated Set/Reset Capability", U.S. Pat. No. 4,274,017 of the common assignee herein, and the circuits described in "High-Speed Look-Ahead Carry"—E. J. Nosowicz et al, "Scale of Two Divider"—C. S. K. Ng et al, and "Cascode Current Switch ALU"—J. H. Underwood, IBM ® Technical Disclosure Bulletin, Vol. 20, No. 12, May 1978, pp 5150–5151, Vol. 21, No. 9, February, 1979, pp 3609–3611, and Vol. 21, No. 12, May 1979, pp 4808–4810, respectively, to name just a few.

However, heretofore in the prior art of which we are aware, modulus-N residue generating circuit apparatus have not been implementable and/or implemented in cascode logic; cf., for example, the integrated circuit (IC) modular modolo 3 module described in U.S. Pat. No. 4,190,893.

SUMMARY OF THE INVENTION

It is an object of this invention to provide modulus-N residue generating circuit apparatus, of the kind where N is odd and greater than one, which is relatively simple, reduces the number of logic circuit components and/or delay stages and/or power, and/or is readily implementable in large scale integrated circuit technology.

It is another object of this invention to provide modulus-N residue generating circuit apparatus of the aforementioned kind which is implementable in cascode current switch logic.

Still another object of this invention is to provide modulus-N residue generating circuit apparatus of the aforementioned kind which is particularly useful for modulus-3 applications.

According to one aspect of the present invention, there is provided circuit apparatus responsive to a digital input signal that is indicative of a multiple bit number. The apparatus in response to the input signal provides a digital output signal indicative of the modulus-N residues of the input signal, where N is a predetermined odd integer greater than one. The apparatus has a current source and an array of multiple modular groups of plural series-connected successive banks of plural semiconductor current switches. The switches of the banks of each group have a predetermined cascode current tree network configuration. Each of the banks has predetermined signal responsive control means for controlling the switches of the particular bank thereof. The control means of each one of the series-connected banks of the same group has a different response level with respect to the respective response levels of the other control means of the other banks of the same group. The array has N output circuit paths. Predetermined ones of the control means of predetermined ones of the groups of the array receive the input signal and in response to the input signal thereat the switches of the modules of the array coact to selectively connect the circuit paths to the current source to provide a current condition in the circuit paths that is indicative of the numerical value of the modulus-N residue that is associated with the value of the number of the input signal present at the predetermined ones of the control means. Output means are coupled to the circuit paths to provide thereat the output signal in accordance with the current conditions of the circuit paths.

The foregoing and other objects, features and advantages of the invention will be apparent from the following more particular description of the preferred embodiments of the invention, as illustrated in the accompanying drawing.

BRIEF DESCRIPTION OF THE DRAWING

FIG. 1 is a schematic block diagram of a preferred embodiment of the modulus-N generator circuit apparatus of the present invention;

FIG. 2 is a schematic block diagram of another preferred embodiment of the modulus-N generator circuit apparatus the present invention;

In the figures, like elements are designated with similar reference characters.

DESCRIPTION OF THE PREFERRED EMBODIMENTS

Figure 3:
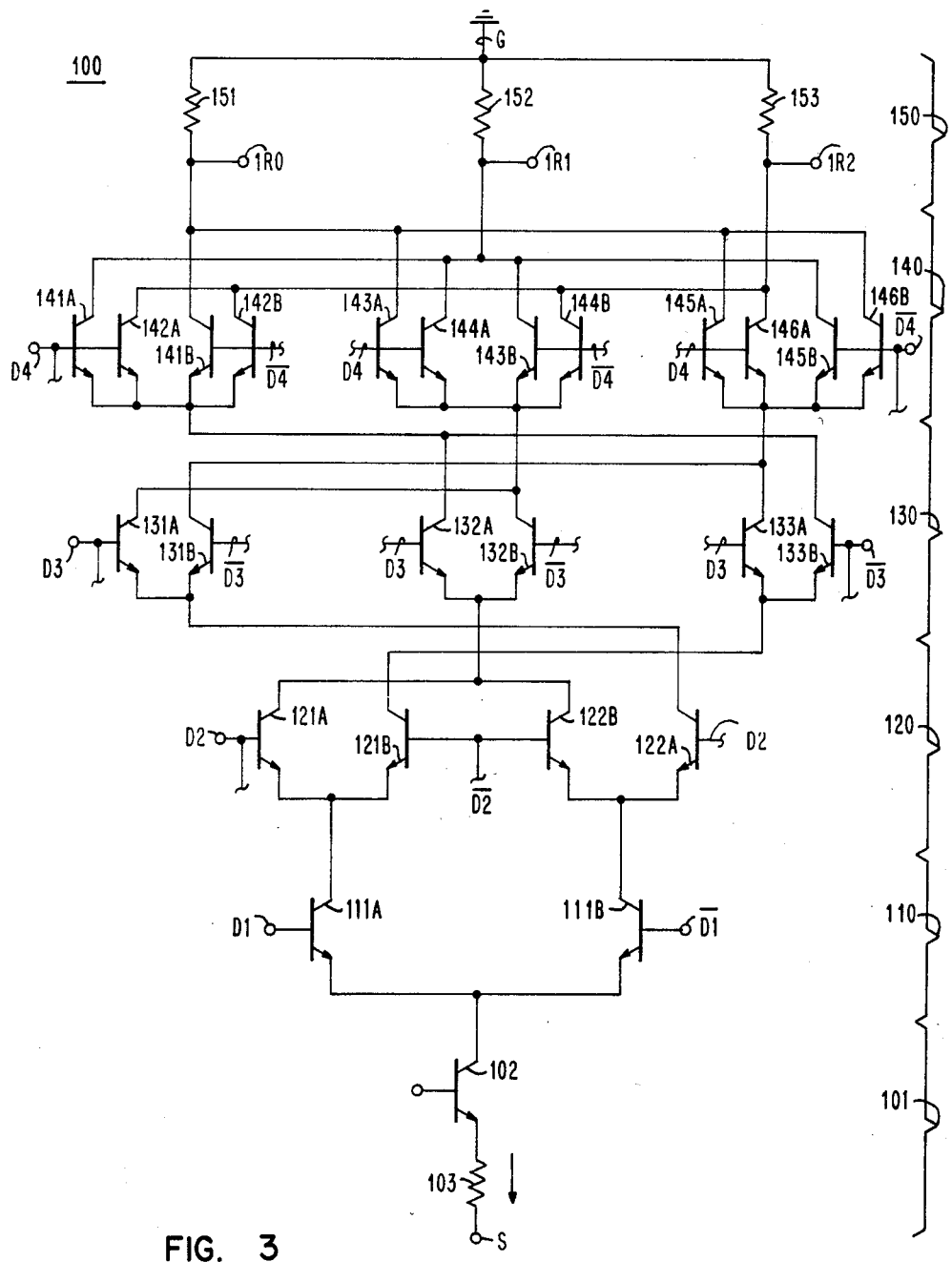
FIG. 3 is a detailed schematic diagram of a preferred embodiment of the circuit block types 100 shown in FIGS. 1 and 2.

Referring to FIGS. 1 and 2, there are shown preferred embodiments of the circuit apparatus of the present invention which operate in serial and parallel modes, respectively, as hereinafter explained.

Each of the circuit apparatus of FIGS. 1 and 2 is responsive to a digital input signal that is indicative of a multiple bit number and in response to the input signal provides a digital output signal indicative of the modulus-N residues of the input signal, N being a predetermined odd integer greater than one. In the preferred embodiments, N=3, and by way of example the digital input signal is indicative of a twenty-eight bit number, that is to say the number has D=28 bits. For the given example, the digital input signal accordingly has twenty-eight data signal bits D01 to D28 that correspond to the low order bit position to the high 0 27 order bit position, 2 to 2, respectively. It should be understood that the digital input signal also includes the correspondingly twenty-eight NOT counterpart bits $\overline{D01}$ to $\overline{D28}$, which can be, for example, derived from the bits D01 to D28 in a manner well known to those skilled in the art. For sake of clarity, however, the NOT counterparts are omitted in FIGS. 1 and 2.

The circuit apparatus of each embodiment is arranged in an array of multiple modular groups or modules, cf. the array of modules 100, 200, 300 of FIG. 1 and the array of modules 100, 400 of FIG. 2. The circuit details of modules 100, 200, 300 and 400 are illustrated in FIGS. 3–6, respectively, and described in greater detail hereinafter. Briefly, however, each module or group has a plural number B of series-connected banks of plural semiconductor current switches. In the preferred embodiments B=4, cf., for example, successive banks 110, 120, 130, 140 of module 100, FIG. 3, and their respective plural semiconductor current switches, e.g. switches 111A, 111B of bank 110, switches 121A, 121B and 122A, 122B of bank 120, etc., FIG. 3. The switches of the banks of each group have a predetermined cascode current tree network logic configuration. Preferably, the switches are all of the same semiconductor type, e.g. bipolars, FETs, etc., to name just a few. By way of example, the switches of FIGS. 3–6 are shown as being bipolar devices: namely, NPN transistors operable in a coupled emitter mode. In the preferred embodiments, the modules are fabricated as monolithic integrated circuits such as VLSI, i.e. very large scale integrated circuits, and preferably all the modules are fabricated on a common substrate.

Figure 4:
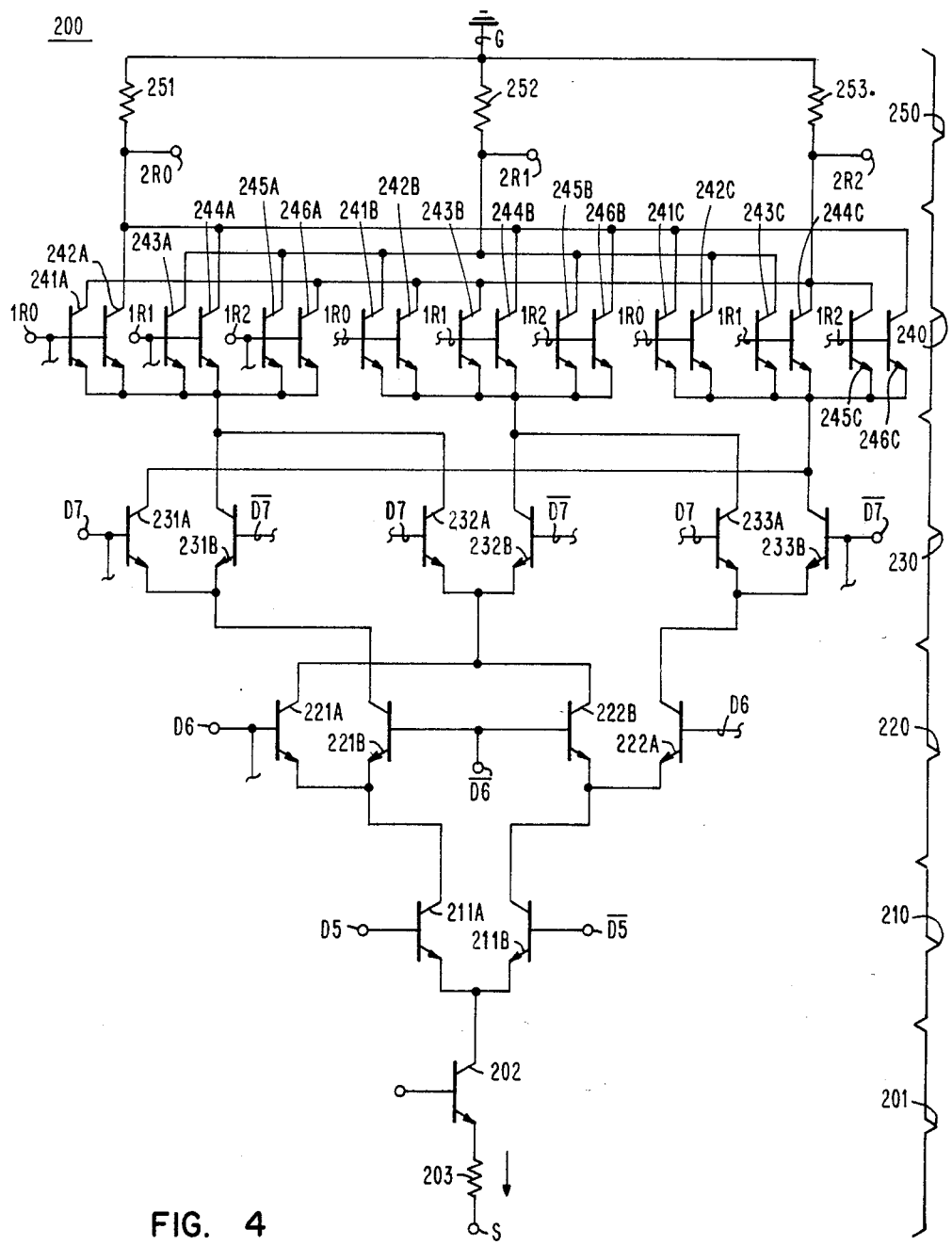
FIG. 4 is a detailed schematic diagram of a preferred embodiment of the circuit block types 200 shown in FIG. 1.
Figure 5:
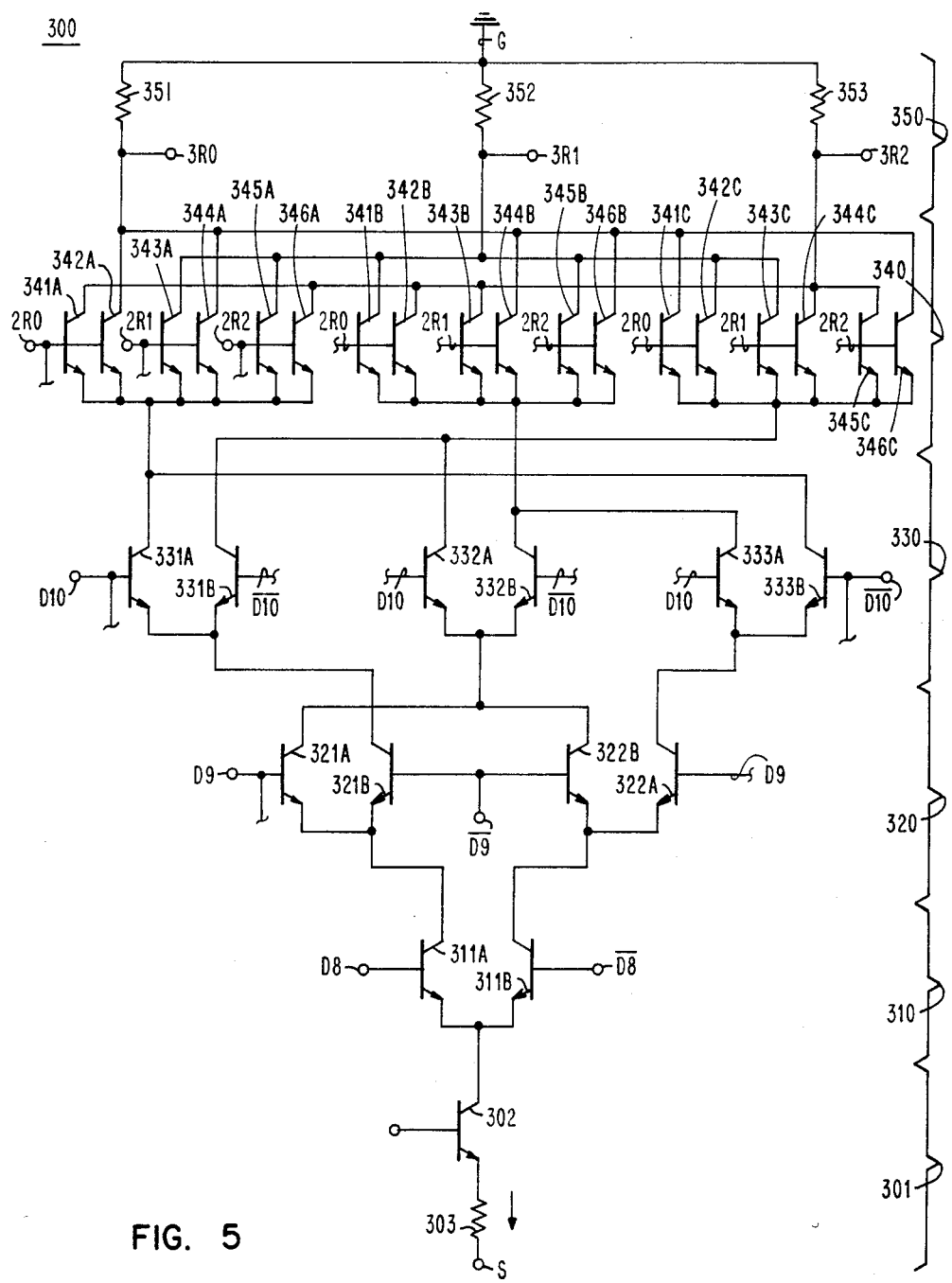
FIG. 5 is a detailed schematic diagram of a preferred embodiment of the circuit block types 300 shown in FIG. 1.
Figure 6:
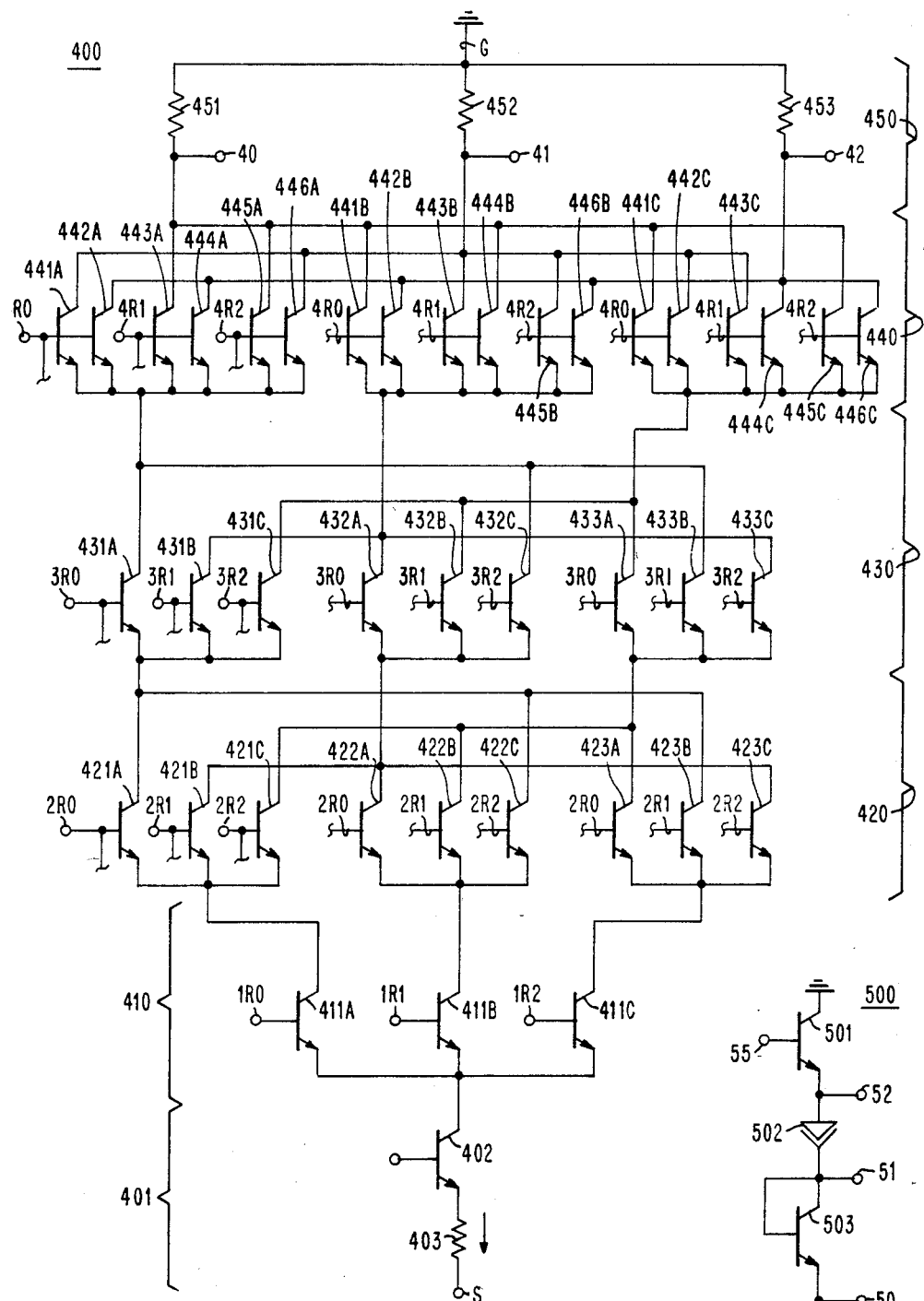
FIG. 6 is a detailed schematic diagram of a preferred embodiment of the circuit block types 400 shown in FIG. 2.

In the preferred embodiments, each module has the same aforementioned plural number of series-connected banks, a typical number being four, for example. Hence, for each of the modules of FIGS. 1 and 2 there are four banks of plural switches that are series-connected in a cascode current tree network configuration. Thus, as shown in FIG. 3, the four successive series-connected banks of a module 100 are the aforementioned four banks 110, 120, 130 and 140, respectively. In a similar manner, the respective four successive series-connected banks of a module 200 and of a module 300 are banks 210, 220, 230 and 240 and banks 310, 320, 330 and 340, respectively, as shown in FIGS. 4 and 5, respectively. Likewise, the four successive series-connected banks of a module 400 are banks 410, 420, 430 and 440 as shown in FIG. 6.

Each of the series-connected banks of the same group or module has predetermined signal responsive control means that controls the switches of the particular bank thereof. For the given NPN coupled emitter implementation, the respective bases of the switches of each bank are the control means for the particular bank. For example, the four control signal inputs D1, D2, D3 and D4 and their respective NOT counterpart control signal inputs $\overline{D1}$, $\overline{D2}$, $\overline{D3}$ and $\overline{D4}$, FIG. 3, are connected to banks 110, 120, 130 and 140, respectively, or a module 100; input D1 and NOT input $\overline{D1}$ of bank 110 being connected to the respective bases of transistors 111A and 111B, respectively; input D2 of bank 120 being commonly connected to the bases for transistors 121A and 122A, and NOT input $\overline{D2}$ being commonly connected to the bases of transistors 121B and 122B; input D3 of bank 130 being commonly connected to the bases of transistors 131A, 132A and 133A, and NOT input $\overline{D3}$ being commonly connected to the bases of transistors 131B, 132B and 133B; and input $\overline{D4}$ of bank 140 being commonly connected to the bases of transistors 141A, 142A, 143A, 144A, 145A and 146A, and NOT input D4 being commonly connected to the bases of transistors 141B, 142B, 143B, 144B, 145B and 146B.

In a similar manner, for a module 200, the three control signal inputs $\overline{D5}$, $\overline{D6}$, and $\overline{D7}$ and their respective NOT counterpart control signal inputs D5, D6, and D7, FIG. 4, are connected to the first three banks 210, 220, and 230, respectively, of the four series-connected banks of a module 200; input D5 and NOT input $\overline{D5}$ of bank 210 being connected to the respective bases of transistors 211A and 211B, respectively; input D6 of bank 220 being commonly connected to the bases of transistors 221A and 222A, and NOT input $\overline{D6}$ being commonly connected to the bases of transistors 221B and 222B; and input D7 of bank 230 being commonly connected to the bases of transistors 231A, 232A and 233A, and NOT input $\overline{D7}$ being commonly connected to the bases of transistors 231B, 232B and 233B.

The last bank 240 of a module 200 is controlled by the output of the preceding module in the array, which output is indicative of the residue of the lower order bits received by all preceding modules in the array. Hence, the control input means of the last bank 240 of a module 200 has N=3 control signal inputs 1R0, 1R1 and 1R2; input 1R0 being commonly connected to the bases of transistors 241A, 242A, 241B, 242B, 241C and 242C; input 1R1 being commonly connected to the bases of transistors 243A, 244A, 243B, 244B, 243C and 244C; and input 1R2 being commonly connected to the bases of transistors 245A, 246A, 245B, 246B, 245C and 246C.

In a similar manner, for a module 300, the three control signal inputs D8, D9, and D10 and their respective NOT counterpart control signal inputs $\overline{D8}$, $\overline{D9}$, and $\overline{D10}$, FIG. 5, are connected to the first three banks 310, 320, and 330, respectively, of the four series-connected banks of a module 300; input D8 and NOT input $\overline{D8}$ of bank 310 being connected to the respective bases of transistors 311A and 311B, respectively; input D9 of bank 320 being commonly connected to the bases of transistors 321A and 322A, and NOT input $\overline{D9}$ being commonly connected to the bases of transistors 321B and 322B; and input D10 of bank 330 being commonly connected to the bases of transistors 331A, 332A and 333A, and NOT input $\overline{D10}$ being commonly connected to the bases of transistors 331B, 332B and 333B.

The last bank 340 of a module 300 is controlled by the output of the preceding module in the array, which output is indicative of the residue of the lower order bits received by all preceding modules in the array. Hence, the control input means of the last bank 340 of a module 300 has N=3 control signal inputs 2R0, 2R1 and 2R2; input 2R0 being commonly connected to the bases of transistors 341A, 342A, 341B, 342B, 341C and 342C; input 2R1 being commonly connected to the bases of transistors 343A, 344A, 343B, 344B, 343C and 344C; and input 2R2 being commonly connected to the bases of transistors 345A, 346A, 345B, 346B, 345C and 346C.

The signal control means of each bank in a module 400 has N=3 signal control inputs. More particularly, as shown in FIG. 6, the three signal inputs 1R0, 1R1 and 1R2 of the first bank 410 are connected to the respective bases of transistors 411A, 411B and 411C, respectively. The three signal inputs 2R0, 2R1 and 2R2 of the next successive, i.e. second, bank 240 are connected as follows: input 2R0 is commonly connected to the bases of transistors 421A, 422A and 423A; input 2R1 is commonly connected to the bases of transistors 241B, 422B and 423B; and input 2R2 is commonly connected to the base of transistors 421C, 422C and 423C. Likewise, the three signal inputs 3R0, 3R1 and 3R2 of the next successive, i.e. third, bank 430 are connected as follows: input 3R0 is commonly connected to the bases of transistors 431A, 432A and 433A; input 3R1 is commonly connected to the base of transistors 431B, 432B and 433B; and input 3R2 is commonly connected to the base of transistors 431C, 432C and 433C. The three signal inputs 4R0, 4R1 and 4R2 of the last bank 440 are connected as follows: input 4R0 is commonly connected to the bases of the three pairs of transistors 441A–442A, 441B–442B and 441C–442C; input 4R1 is commonly connected to the bases of the three pairs of transistors 443A–444A, 443A–444B and 443C–444C; and input 4R2 is commonly connected to the bases of the three pairs of transistors 445A–446A; 445B–446B and 445C–446C.

For each module, the control means for each of the series-connected banks of the particular module has a different response level with respect to the respective response levels of the control means of the other banks of the same particular module. Moreover, in the preferred embodiments, the respective control means for the corresponding banks of all the modules of the array have substantially the same identical response level. Thus, in the array of FIG. 1, the respective banks 110, 210 and 310 of modules 100, 200 and 300 have one response level, the respective banks 120, 220 and 320 have another response level, the respective banks 130, 230 and 330 have still another response level, and the respective banks 140, 240 and 340 have still another response level. Similarly, in the array of FIG. 2, the respective banks 110 and 410 of modules 100 and 400 have one response level, the respective banks 120 and 420 have another response level, the respective banks 130 and 430 have still another response level, and the respective banks 140 and 440 have still another response level. Typical response levels are indicated hereinafter in Table No. 1 below.

Each of the respective arrays of FIGS. 1–2 have N output circuit paths, but are omitted in FIGS. 1 and 2 for sake of clarity. For the preferred modulus N=3, there are thus three output circuit paths in each of the arrays of the preferred embodiments and are located in the last module of the particular array. The array of FIG. 1 uses a module 300 as its last module for the given twenty-eight bit input signal example. Hence, the three output paths are located in the module 300 designated NO. 9 in FIG. 1, and the three circuit paths are associated with the resistors 351, 352 and 353, respectively, thereof, cf. FIG. 5, and correspond with residue values of 0, 1 and 2, respectively, for N=3. If the array of FIG. 1, were to terminate in a module 200, as might be the case, for example, if the array was designed to terminate with the module 200 designated NO. 8 to accommodate a multiple bit number of a maximum of twenty-three, or twenty-four or twenty-five bits and accordingly the input signal would have D01–D23, or D01–D24 or D01–D25 signal bits, respectively, then the three output circuit paths are associated with the resistors 251, 252 and 253, respectively, of the module 200, cf. FIG. 4, and correspond with the residue values 0, 1 and 2, respectively. For the array of FIG. 2, a module 400 is used as its last module and its designated NO. 10 therein, and its three circuit paths are associated with the resistors 451, 452 and 453, respectively, thereof, cf. FIG. 6, and correspond with the residue values 0, 1 and 2, respectively.

Output means are coupled to the three output circuit paths and in the embodiments of FIGS. 1 and 2 are shown as the three output terminals designated with the reference characters R0, R1 and R2. In the case of the module NO. 9 of FIG. 1, outputs R0, R1 and R2 correspond to the outputs 3R0, 3R1 and 3R2 of a module 300, cf. FIG. 5. Likewise, outputs R0, R1 and R2 of module NO. 10 of FIG. 2 correspond to the outputs 40, 41 and 42 of a module 400, cf. FIG. 6. In response to the input signal bits D01–D28 and their NOT counterparts fed to predetermined ones of the control means of predetermined ones of the modules of the particular array, cf. FIGS. 1 and 2, the switches of the modules coact to selectively connect the aforementioned circuit paths to a current source, cf. input stages 101, 201, 301 and 401, to provide a current condition in the circuit paths that is indicative of the numerical value of the modulus-N residue that is associated with the value of the number of the input signal present at the predetermined ones of the control means. The output means R0, R1 and R2, which are coupled to the circut paths and hence correspond to the residue values 0, 1 and 2, respectively, thus provide thereat the aforementioned output signal which is indicative of the residue of the input signal bits D01–D28, in accordance with the current condition of the circuit paths.

The preferred embodiments use a convention whereby the 1 and 0 bits are represented by the ON and OFF levels, respectively, of the control signal, also referred to as the UP and DOWN levels, respectively. Moreover, the preferred embodiments use a convention in the output stages, i.e. stages 150, 250, 350 and 450 of modules 100, 200, 300 and 400, respectively, whereby 1 and 0 bits present at a respective output of a module; to wit: outputs 1R0, 1R1 and 1R2 of a module 100, output 2R0, 2R1 and 2R2 of a module 200, output 3R0, 3R1 and 3R2 of a module 300, and outputs 40, 41 and 42 of a module 400; is represented, i.e. indicated, by the absence and presence, respectively, of current through the resistor to which the particular output is connected, cf. connections of outputs 1R0, 1R1 and 1R2 to resistors 151, 152 and 153, respectively, of module 100, connections of outputs 2R0, 2R1 and 2R2 to resistors 251, 252 and 253, respectively, of module 200, ..., and connections of outputs 40, 41 and 42 to resistors 451, 452 and 453, respectively. In accordance with the convention, a current condition is established in the output stage of the module wherein there is concurrently an absence of current through one of the three resistor paths and the presence of current in the other two resistor paths, which condition provides an output residue bit pattern at the module's three outputs that is indicative of the residue remainder of the input information signal bits present at the four inputs of the particular module, the particular resistor path not having any current under such conditions being the one indicative of the particular residue value, i.e. a zero, one or two.

It can be shown that for modules which accept data bits, e.g. modules 100, 200, 300, the number T of transistors used in each of the banks, except for the last, has the following relationship, to wit:

$$T = R \times I \quad (1)$$

where

R equals the rank of the bank, i.e. first, second, etc., and

I equals the number of inputs.

Also, it can be shown that the number of transistors T used in the last bank of a module which accepts data has the following relationship, to wit:

$$T = 2Rp \times I \quad (2)$$

where Rp is the rank of the preceding bank.

Thus, in each of the first banks 110, 210, 310 of modules 100, 200, 300 there are $T = 1 \times 2 = 2$ transistors or one pair of transistors. Likewise, in each of the next banks 120, 220, 320 there are $T = 2 \times 2 = 4$ transistors or two pairs, and in each of the next banks 130, 230, 330 there are $T = 3 \times 2 = 6$ transistors or three pairs. In the last bank 140 of a module 100 there are $T = 2 \times 3 \times 2 = 12$ transistors or three double pairs, and in each of the last banks 240 and 340 of a module 200 and a module 300 there are $T = 2 \times 3 \times 3 = 18$ transistors or three triple pairs.

On the other hand, it can be shown that for modules which accept only residue bits, e.g. module 400, the number T of transistors used in the first bank has the following relationship, to wit:

$$T = N \quad (3)$$

where N equals the modules.
For each of the intermediate banks of the last mentioned modules, it can be shown that the number T of transistors used in each such bank has the following relationship, to wit:

$$T = N \times N. \quad (4)$$

Also, it can be shown that the number T of transistors used in the last last bank of the last mentioned modules has the following relationship, to wit:

$$T = 2 \times N \times N. \quad (5)$$

Thus, the first bank 410 of a module 400 use $N = 3$ transistors, each of the second and third banks 420 and 430 uses $3 \times 3 = 9$ transistors, and the last bank 440 uses $2 \times 3 \times 3 = 18$ transistors.

It should be understood that each of the input data bits D01–D28, as well as its NOT counterpart, has UP and DOWN levels corresponding to a binary 1 and 0, respectively, and which are compatible to the ON and OFF response levels, respectively, of the particular one of the inputs D1–D10 and NOT inputs to which the particular bit and its NOT bit are being fed. Should the data bit signals be derived from a source that provides each of the data bits with the same UP and the same DOWN levels, appropriate level shifters may be used to shift the bit signal levels to ones compatible to the response levels of the inputs D1–D10 in a manner well known to those skilled in the art.

For a nominal supply voltage V of $-4.25$ volts applied to power supply terminal S, the typical UP/DOWN or ON/OFF response levels of the transistors of the banks of the modules 100–400 and the ON level of the current supply transistors 102, 202, 302 and 402 of their input stages are given in the following Table No. 1.

TABLE NO. 1

| ON | OFF | |
|---|---|---|
| volts | | BANKS/STAGES |
| 0 | −0.3 | 140-240-340-440 |
| −0.8 | −1.1 | 130-230-330-430 |
| −1.4 | −1.7 | 120-220-320-420 |
| −2.2 | −2.5 | 110-210-310-410 |
| −3.0 | | 101-201-301-401 |

Further detailed descriptions of the individual modules and the preferred embodiments, together with detailed descriptions of their respective operations are next discussed under appropriate corresponding titles, it being understood that all of the modules 100 are identically configured, all the modules 200 are identically configured, all the modules 300 are identically configured, and also all the modules 400 are identically configured. For sake of convenience, Tables Nos. 2–9 discussed hereinafter are located under the title Appendix below.

MODULE 100

Referring now to FIG. 3, in each module 100, the first bank 110 has a differential pair of transistors 111A and 111B, which are responsive to the particular low order bit signal and its not counterpart bit signal, respectively, that are applied to the base inputs D1 and $\overline{D1}$, respectively. The next successive bank 120 is connected in a cascode current tree relationship to the bank 110. As such, bank 120 has two differential pairs of transistors, to wit: the pair of transistors 121A and 121B and the pair of transistors 122A and 122B. The commonly connected bases of transistors 121A and 122A and the commonly connected bases of transistors 121B and 122B are responsive to the the next higher order bit signal and its NOT counterpart bit signal that are applied to the base inputs D2 and $\overline{D2}$, respectively. The collector of the transistor 111A of bank 110 is connected serially to the commonly connected emitters of transistors 121A, 121B; and the collector of the transistor 111B of bank 110 is connected serially to the commonly connected emitters of the transistors 122A, 122B. In turn, the next successive bank 130 is connected in a cascode current tree relationship to the bank 120. As such, bank 130 has three differential pairs of transistors, to wit: the pair of transistors 131A and 131B, the pair 132A and 132B, and the pair of transistors 133A and 133B. The commonly connected bases of transistors 131A, 132A and 133A and the commonly connected bases of transistors 131B, 132B and 133B are responsive to the the next higher order bit signal and its NOT counterpart bit signal that are applied to the base inputs D3 and $\overline{D3}$, respectively. The commonly connected collectors of the transistors 121A and 122B of bank 120 are connected serially to the commonly connected emitters of transistors 132A, 132B of bank 130; the collector of transistor 121B of bank 120 is connected serially to the commonly connected emitters of transistors 133A, 133B; and the collector of transistor 122A of bank 120 is serially connected to the commonly connected emitters of the transistors 131A, 131B.

The next successive bank 140 is connected in a cascode current tree relationship to the bank 130. As such, bank 140 has three double differential pairs of transistors, to wit: the first double pair of transistors being the pair of transistors 141A and 142B and the pair 142A and 141B; the second double pair of transistors being the pair of transistors 143A and 143B and the pair 144A and 144B; and the third double pair of transistors being the pair of transistors 145A and 145B and the pair 146A and 146B.

The commonly connected bases of transistors 141A, 142A, 143A, 144A, 145A and 146A and the commonly connected bases of transistors 141B, 142B, 143B, 144B, 145B and 146B are responsive to the high order bit signal and its NOT counterpart bit signal that are applied to the base inputs D4 and $\overline{D4}$, respectively. The commonly connected collectors of the transistors 131A and 132B of bank 130 are connected serially to the commonly connected emitters of transistors 143A, 144A, 143B, 144B of bank 140; the commonly connected collectors of transistors 131B and 133A are connected serially to the commonly connected emitters of transistors 145A, 146A, 145B, 146B; and the commonly connected collectors of transistors 132A and 133B are serially connected to the commonly connected emitters of the transistors 141A, 142A, 141B, 142B.

The last bank, i.e. bank 140, in turn is connected to the output stage 150 of the module 100. Thus, as shown in FIG. 3, the commonly connected collectors of the transistors 141B, 143A, 145A and 146B of bank 140 are serially connected to resistor 151 of stage 150. Furthermore, the commonly connected collectors of the transistors 141A, 144A, 143B and 145B are serially connected to resistor 152, and the commonly connected collectors of the transistors 142A, 142B, 144B and 146A are serially connected to resistor 153.

The module 100 is provided with an input stage 101. A power supply, not shown for sake of clarity, of appropriate polarity is connected across the supply terminal S of stage 101 and the commonly grounded terminal G of stage 150. Preferably included in the input stage 101 is a switch 102 which is compatible with the switches of the banks 110-140 and thus for the given types thereof is shown as a common emitter NPN. The collector of transistor 102 is connected to the commonly connected emitters of the transistors 111A and 111B of the first bank. The bias level to the base of switch 102 in coaction with the current limiting resistor 103, connected between the emitter of switch 102 and terminal S, act as a current source that controls the amount of current and power used in the module 100. Preferably, switch 102 and the aforedescribed counterpart switches remain in the ON state by maintaining the base control signal at the ON level. If desired, however, a common clock or synchronizing pulse signal, not shown, may be fed to the base of switch 102 of module 100 and the bases of the counterpart switches of the other modules of the particular array in which it is incorporated, e.g. switches 202 and 302 of modules 200 and 300 in the array of FIG. 1 or switches 102 and 402 of the other modules 100 and modules 400 in the array of FIG. 2. This would allow control of the power duty cycle.

In operation, with the switch 102 in the ON state, for the various 1 and 0 bit combinations to the inputs D1-D4 of a module 100 and current path convention, there are thirty-two different possible current paths A01-A32, i.e. two each for each of the sixteen bit combinations. Table No. 2 below, cf. Appendix, indicates the sixteen bit combinations relative to the low to high order bit inputs D1 to D4, respectively, of a module 100, and the thirty-two current paths A01-A32 and the elements of each path, excluding transistor 102 and resistor 103 for sake of brevity.

It should be noted in Table No. 2 that for each pair of circuit paths associated with the same particular signal bit combination present at inputs D1-D4, e.g. the pair of paths A01 and A02 associated with the signal bit combination 0000, the two current carrying paths of the particular pair share common circuit elements in the input stage and the first to penultimate banks, e.g. resistor 103 and transistor 102 of stage 101 and transistors 111B, 122B and 132B of the respective banks 110, 120 and 130; and that at the last bank the current in the common path is divided and passes through the two transistors of the last bank associated with the particular signal bit combination and from there through the two resistors of the last stage that are connected to the last two mentioned transistors, e.g. transistors 143B and 144B of bank 140 and the resistors 152 and 153, respectively connected thereto. Accordingly, there is no current in the other resistor, e.g. resistor 151, and the outputs 1R0, 1R1 and 1R2 are at the proper residue bit pattern for associated input bits, e.g. a 1, 0 and 0, respectively, for the input bits 0000.

For sake of clarity, in Table No. 3 below, there is indicated the sixteen binary bit combinations 0000 to 1111 applied to the inputs D1 to D4, their corresponding decimal values DEC 0 to 15 and decimal residue values Rd, i.e. 0, 1 or 2, and the particular resistors which have no current and current passing through as indicated under the appropriate output/resistor element headings 1R0/151, 1R1/152, 1R2/153, by the absence of a current path and the presence of the appropriate two current paths taken from Table No. 2.

Thus, by way of example, if the value of the binary number is 0111, assuming the convention where low order bit is on the right and the higher order bits increase from right to left, the corresponding decimal value is 7, and hence the decimal value of the residue is 1. Accordingly, there is no current in the resistor 152 and current passes through the other two resistors 151 and 153 via the circuit paths A15 and A16. Accordingly, output 1R1 is at an UP or 1 level, i.e. ground, and outputs 1R0 and 1R2 are at DOWN or 0 levels, i.e. −0.3 volts.

MODULE 200

Referring now to FIG. 4, in each module 200, the first bank 210 has a differential pair of transistors 211A and 211B, which are responsive to the particular low order bit signal and its not counterpart bit signal, respectively, that are applied to the base inputs D5 and $\overline{D5}$, respectively.

The next successive bank 220 is connected in a cascode current tree relationship to the bank 210. As such, bank 220 has two differential pairs of transistors, to wit: the pair of transistors 221A and 221B and the pair of transistors 222A and 222B. The commonly connected bases of transistors 221A and 222A and the commonly connected bases of transistors 221B and 222B are responsive to the next high order bit signal and its NOT counterpart bit signal that are applied to the base inputs D6 and $\overline{D6}$, respectively. The collector of the transistor 211A of bank 210 is connected serially to the commonly connected emitters of transistors 221A, 221B; and the collector of the transistor 211B of bank 210 is connected serially to the commonly connected emitters of the transistors 222A, 222B. As such, the banks 210 and 220 of a module 200 are identically configured and interconnected as their counterpart banks 110 and 120 of a module 100.

The next successive bank 230 is connected in a cascode current tree relationship to the bank 220. Accordingly, bank 230 has three differential pairs of transistors, to wit: the pair of transistors 231A and 231B, the pair 232A and 232B, and the pair of transistors 233A and 233B. The commonly connected bases of transistors 231A, 232A and 233A and the commonly connected bases of transistors 231B, 232B and 233B are responsive to the next high order bit signal and its NOT counterpart bit signal that are applied to the base inputs D7 and $\overline{D7}$, respectively. The commonly connected collectors of the transistors 221A and 222B of bank 220 are connected serially to the commonly connected emitters of transistors 232A, 232B of bank 230, similar to their respective counterparts of banks 120 and 130 of a module 100. However, the interconnections of the collectors 221A and 222B are reversed with respect to the interconnections of their respective counterparts in bank 120 to bank 130; the collector of transistor 222A of bank 220 being connected serially to the commonly connected emitters of transistors 233A, 233B; and the collector of transistor 221B of bank 220 being serially connected to the commonly connected emitters of the transistors 231A, 231B.

As aforedescribed, the inputs D4, D5 and D6 and the associated respective NOT counterpart inputs of the first three banks 210, 220 and 230 of a module 200 receive three successive predetermined data bits and their NOT counterparts of the input data signal, representing eight possible bit combinations. Moreover, the control means of the last bank 240 of a module 200 has three inputs 1R0, 1R1 and 1R2.

Accordingly, the 18 transistors of the next successive bank 240 are arranged in three equal groups of six each and the bank 240 is connected in a cascode current tree relationship to the bank 230, the first group being transistors 241A–246A, the second group being transistors 241B–246B, and the third group being transistors 241C–246C. The commonly connected collectors of the transistors 231A and 233B of bank 230 are connected serially to the commonly connected emitters of the last mentioned third group of transistors 241C, etc.; the commonly connected collectors of transistors 231B and 232A are connected serially to the commonly connected emitters of transistors of the last mentioned first group of transistors 241A, etc.; and the commonly connected collectors of transistors 232B and 233A are serially connected to the commonly connected emitters of the last mentioned second group of transistors 241B, etc.

The commonly connected bases of transistors 241A, 242A, 241B, 242B, 241C and 242C are responsive to the residue bit signal at input 1R0. The commonly connected bases of transistors 243A, 244A, 243B, 244B, 243C and 244C are responsive to the residue bit signal at input 1R1. The commonly connected bases of transistors 245A, 246A, 245B, 246B, 245C and 246C are responsive to the residue bit signal at input 1R2.

The last bank 240 in turn is connected to the output stage 250 of the module 200. Thus, as shown in FIG. 4, the commonly connected collectors of the transistors 242A, 244A, 244B, 246B, 241C and 246C of bank 240 are serially connected to resistor 251 of stage 250. Furthermore, the commonly connected collectors of the transistors 243A, 245A, 241B, 245B, 242C and 243C are serially connected to resistor 252, and the commonly connected collectors of the transistors 241A, 246A, 242B, 243B, 244C and 245C are serially connected to resistor 253.

The input stage 201 of the module 200 is identical to its aforedescribed counterpart, i.e. input stage 101, of module 1 and hence its description and operation are omitted for sake of brevity.

In operation, with the switch 202 in the ON state, for the various 1 and 0 bit combinations to the inputs D5–D7 of a module 200 and aforedescribed current path convention, there are forty-eight different possible current paths B01–B48, i.e. six each for each of the eight possible combinations of bits present at the inputs D5–D7. Table No. 4 below indicates the eight bit combinations of the low to high order bit inputs D5 to D7, respectively, of a module 200 and the particular one of the three inputs 1R1, 1R2, 1R3 of the module 200 which is at a 1 bit level, and the corresponding forty-eight current paths B01–B48 and the elements of each of the path, excluding transistor 202 and resistor 203 for sake of brevity.

It should be noted in Table No. 4 that for each pair of circuit paths associated with the same particular signal bit combination present at inputs D5–D7 and 1R0–1R2, e.g. the pair of paths B01 and B02 associated with the signal bit combination 0001 present at inputs D5–D7 and 1R0, the two current carrying paths of the particular pair share common circuit elements in the input stage and the first to penultimate banks, e.g. resistor 203 and transistor 202 of stage 201 and transistors 211B, 222B and 232B of the respective banks 210, 220 and 230; and that at the last bank the current in the common path is divided and passes through the two transistors of the last bank associated with the particular signal bit combination and from there through the two resistors of the last stage that are connected to the last two mentioned transistors, e.g. transistors 241B and 242B of bank 240 and the resistors 252 and 253, respectively connected thereto. Accordingly, there is no current in the other resistor, e.g. resistor 251, and the outputs 2R0, 2R1 and 2R2 are at the proper residue bit pattern for associated input bits, e.g. a 1, 0 and 0, respectively, for the combination of input bits 0,0,0,1 present at inputs D5–D7, 1R0, respectively.

For sake of clarity, in Table No. 5 below, there is indicated the eight binary bit combinations 000 to 111 applied to the inputs D5 to D7, their corresponding decimal values DEC 0 to 7 and decimal residue values Rd, i.e. 0, 1 or 2, for each of the three binary bit combinations 100, 010 and 001 applied to the inputs 1R0–1R2 of module 200, and the particular resistors which have no current and current passing through as indicated under the appropriate output/resistor element headings 2R0/251, 2R1/252, 2R2/253, by the absence of a current path and the presence of the appropriate two current paths taken from Table No. 4.

Thus, by way of example, if the value of the binary number is 110, as represented by the signal bits 0,1,1 applied to the inputs D5–D7, respectively, the corresponding decimal value is 6, and hence the decimal value of residue is 0 as pertaining to that particular group of bits. Depending on which of the three residue values of the lower order bits of the binary number being applied to the lower order bit inputs of the preceding modules, one of the three possible current conditions will be active. Assuming that the residue value of the preceding modules is a 2, then the inputs 1R0 and 1R1 of module 200 are at 0 levels and its input 1R2 is at a 1 level, resulting in the current paths B41 and B42 passing current through the resistors 251 and 252, respectively, of the module 200 and no current in the resistor 253 thus providing DOWN levels at the outputs 2R1 and 2R2 and an UP level at the output 2R2 and thereby indicating the correct residue value, i.e. 2, of those signal bits which are applied to the data inputs of the module 200 and all preceding modules.

MODULE 300

Referring now to FIG. 5, in each module 300, the input stage 301 and the three banks 310–330 and their intra and interconnections are identical to their aforedescribed counterparts of module 200, and their description is thus omitted herein for sake of brevity.

As aforedescribed, the inputs D8, D9 and D10 and the associated respective NOT counterpart inputs of the first three banks 310, 320 and 330 of a module 300 receive three successive predetermined data bits and their NOT counterparts of the input data signal, representing eight possible bit combinations. Moreover, the control means of the last bank 340 of a module 300 has three inputs 2R0, 2R1 and 2R2.

Accordingly, similar to the bank 240 of a module 200, the next successive bank 340 has its eighteen transistors arranged in three equal groups of six each and is connected in a cascode current tree relationship to the bank 330, the first group being transistors 341A–346A, the second group being transistors 341B–346B, and the third group being transistors 341C–346C. Also, similar to the interconnection of the commonly connected collectors of their counterpart transistors 232B and 233A of a module 200 to the commonly connected emitters of transistors 241A, etc., the commonly connected collectors of transistors 332B and 333A are serially connected to the commonly connected emitters of the last mentioned second group of transistors 341B, etc.

Also similar to the connections of their counterparts in the bank 240 of a module 200, are the connections of the bases of the transistors of bank 340 of a module 300 to the inputs 2R0–2R2 of the bank 340. Thus, the commonly connected bases of transistors 341A, 342A, 341B, 342B, 341C and 342C are responsive to the residue bit signal at input 2R0; the commonly connected bases of transistors 343A, 344A, 343B, 344B, 343C and 344C are responsive to the residue bit signal at input 2R1; and the commonly connected bases of transistors 345A, 346A, 345B, 346B, 345C and 346C are responsive to the residue bit signal at input 2R2.

However, the interconnections of the commonly connected collectors of the transistors 331A and 333B and of the commonly connected collectors of transistors 331B and 332A of a module 300 are reversed with respect to the interconnections of their respective counterparts in the bank 230 to the bank 240 of a module 200; the commonly connected collectors of transistors 331A and 333B of bank 330 being connected serially to the commonly connected emitters of the last mentioned first group of transistors 341A, etc.; and the commonly connected collectors of transistors 331B and 332A being connected serially to the commonly connected emitters of the last mentioned third group of transistors 341C, etc.

In each module 300, the input stage 301 and the three banks 310–330 and their interconnections are identical to their aforedescribed counterparts of a module 200, and their description is thus omitted herein for sake of brevity. The last bank 340 in turn is connected to the output stage 350 of the module 300. In each module 300, the bank 340 and 350 and their interconnections are identical to their aforedescribed counterparts of a module 200, and their description is thus omitted herein for sake of brevity.

In operation, as was the case for a module 200, with the switch 302 in the ON state, for the various 1 and 0 bit combinations to the inputs D8–D10 of a module 300 and aforedescribed current path convention, there are forty-eight different possible current paths C01–C48, i.e. six each for each of the eight bit combinations. Table No. 6 below indicates the eight bit combinations of the low to high order bit inputs D8 to D10, respectively, of a module 300 and the particular one of the three inputs 2R1, 2R2, 2R3 of the module 300 which is at a 1 bit level, and the corresponding forty-eight current paths C01–C48 and the elements of each of the path, excluding transistor 302 and resistor 303 for sake for brevity.

In a manner similar to that noted with respect to Table No. 4 for a module 200, it can be shown from Table No. 6 that each of the circuit pair paths of a module 300 associated with the bit pattern at its inputs D8–D10, 2R0–2R2 shares common elements in the input stage 301 and first to penultimate banks 310–330, and that at the last bank 340 the current in the common path is divided and passes through the two transistors of the last bank associated with the particular input signal bit combination to the last mentioned inputs and from there through the two resistors of the last stage that are connected to the last two mentioned transistors, and as such provides the correct residue bit pattern for the particular input bit combination.

For sake of clarity, in Table No. 7 below, there is indicated the eight binary bit combinations 000 to 111 applied to the inputs D8 to D10, their corresponding decimal values DEC 0 to 7 and decimal residue values Rd, i.e. 0, 1 or 2, for each of the three binary bit combinations 100, 010 and 001 applied to the inputs 2R0-2R2 of module 300, and the particular resistors which have no current and current passing through as indicated under the appropriate output/resistor element headings 3R0/351, 3R1/352, 3R2/353, by the absence of a current path and the presence of the appropriate two current paths taken from Table No. 6.

Thus, by way of example, if the value of the binary number is 110, as represented by the signal bits 0,1,1 applied to the inputs D8-D10, respectively, the corresponding decimal value is 6, and hence the decimal value of residue is 0 as pertaining to that particular group of bits. Depending on which of the three residue values of the lower order bits of the binary number being applied to the lower order bit inputs of the preceding modules, one of the three possible current conditions will be active. Assuming that the residue value of the preceding modules is a 2, then the inputs 2R0 and 2R1 of module 300 are at 0 levels and its input 2R2 is at a 1 level, resulting in the current paths C41 and C42 passing current through the resistors 351 and 352, respectively, of the module 300 and no current in the resistor 353 thus providing DOWN levels at the outputs 3R1 and 3R2 and an UP level at the output 3R2 and thereby indicating the correct residue value, i.e. 2, of those signal bits which are applied to the data inputs of the module 300 and all preceding modules.

MODULE 400

Referring now to FIG. 6, unlike a module 100 which is responsive only to input data bit signals or a module 200 or 300 which is responsive to both input data bit signals and the residue bit signals from the preceding module in the array of FIG. 1, a module 400 is responsive only to the residue bit signals from the preceding modules in the array of FIG. 2, the later residue bit signals being derived from data bit signals fed to the array of FIG. 2. As such, each of the series-connected banks of a module 400 has N=3 control inputs for receiving the three residue bits of the preceding module connected thereto. Thus, for the four series-connected bank of the embodiment of FIG. 6, a module 400 has the capability of receiving the residue bits from a maximum of four preceding modules.

In each module 400, the first bank 410 of transistors 411A, 411B and 411C are connected in a cascode current tree relationship to the next bank 420, the collector of transistor 411A being connected to the commonly connected emitters of transistors 421A, 421B and 421C of bank 420, the collector of transistor 411B being connected to the commonly connected emitters of transistors 422A, 422B and 422C of bank 420, and the collector of transistor 411C being connected to the commonly connected emitters of transistors 423A, 423B and 423C of bank In turn, the transistors of bank 420 are connected to the next successive bank 430 in a cascode current tree relationship, as follows, to wit: the commonly connected collectors of transistors 421A, 422C and 423B of bank 420 are connected to the commonly connected emitters of transistors 431A, 431B and 431C of bank 430; the commonly connected collectors of transistors 421B, 422A and 423C of bank 420 are connected to the commonly connected emitters of transistors 432A, 432B and 432C of bank 430; and the commonly connected collectors of transistors 421C, 422B and 423A of bank 420 are connected to the commonly connected emitters of transistors 433A, 433B and 433C of bank 430.

Similarly, in turn, the transistors of bank 430 are connected to the next successive, i.e. last, bank 440 in a cascode current tree relationship, as follows, to wit: the commonly connected collectors of transistors 431A, 432C and 433B of bank 430 are connected to the commonly connected emitters of transistors 441A-446A of bank 440; the commonly connected collectors of transistors 431B, 432A and 433C of bank 430 are connected to the commonly connected emitters of transistors 441B-446B of bank 440; and the commonly connected collectors of transistors 431C, 432B and 433A of bank 430 are connected to the commonly connected emitters of transistors 441C-446C of bank 440.

The input stage 401 of a module 400 is similar to the counterpart input stages 101, 201 and 301 of the other modules, the collector of switch 402 being connected to the commonly connected emitters of the transistors 411A-411B of the first bank 401. Accordingly, for sake of brevity, its description and operation is omitted herein.

The commonly connected collectors of transistors 441A, 446A, 443B, 445B, 442C and 443C of the last bank 440 are connected to resistor 452 of the output stage 450 of module 400. Likewise, the commonly connected collectors of transistors 442A, 444A, 442B, 446B, 444C and 446C of the last bank 440 are connected to resistor 453. Also, the commonly connected collectors of transistors 443A, 445A, 441B, 444B, 441C and 445C of the last bank 440 are connected to resistor 451.

In operation, with the switch 402 in the ON state, for the various 1 and 0 bit combinations to the inputs 1R0, etc., of a module 400, it can be shown, as is apparent to those skilled in the art, that for the aforedescribed current path convention, there are one-hundred sixty-two ($2 \times 3 \times 27 = 162$) different possible current paths in a module 400. Table No. 8 below is a truth table for module 400, indicating the 27 possible bit combinations present at the nine inputs 1R1 to 3R2 and the corresponding bit combinations present at the outputs 40 to 42 when a 1 bit is present at the inputs 4R0, 4R1 and 4R2, respectively, and which results in a combined total of $27 \times 3 = 81$ bit combinations at the twelve inputs 1R1-4R2, with two of the aforementioned 162 paths being associated with each of the 81 bit combinations.

It can be shown, using Table No. 8 as is apparent to those skilled in the art, that each of the 81 pair of circuit paths of a module 300 associated with the particular bit pattern at its twelve inputs 1R0-4R2 shares common elements in the input stage 301 and first to penultimate banks 310-330, and that at the last bank 340 the current in the common path is divided and passes through the two transistors of the last bank 340 that are associated with the particular input signal bit combination to the last mentioned inputs and also through the two resistors of the last stage that are connected to the last two mentioned transistors, and as such provides the correct residue bit pattern for the particular input bit combination.

The operational description of a module 400 will be further discussed hereinafter in conjunction with the operational description of the array of FIG. 2.

FIG. 1 ARRAY

Referring now to FIGS. 1 and 3-5, the series operational mode apparatus embodiment will now be described in greater detail. In this embodiment, the residue bits of each module of the array are fed serially to the next successive module in the array.

For the twenty-eight bit input signal, the array of FIG. 1 has nine modules designated Nos. 1 to 9. More particularly, the array of FIG. 1 begins with a single module 100, No. 1, and followed successively thereafter by eight alternating modules 200 and 300, Nos. 2 to 9, four of each type. Module No. 1 receives the first four low order data bit signals D01–D04 at its inputs D1–D4, respectively. Module No. 2 receives the next three successive higher order data bit signals D05–D07 at its inputs D5–D7, respectively; module No. 3 receives the next three higher order data bit signals D08–D10 at its inputs D8–D10, respectively; module No. 4 receives receives the next three successive higher order data bit signals D11–D13 at its inputs D5–D7, respectively; and so forth.

Each successive module Nos. 2 to 9 in the array, has the control inputs of its fourth bank connected to the outputs of the output stage of the preceding module. Thus, the inputs 1R0–1R2 of the fourth bank 240 of module No. 2 are connected to the correspondingly designated outputs 1R0–1R2 of module No. 1; the inputs 2R0–2R2 of the fourth bank 340 of module No. 3 are connected to the correspondingly designated outputs 2R0–2R2 of module No. 2; the inputs 1R0–1R2 of the fourth bank 240 of module No. 4 are connected to the outputs 3R0–3R2, respectively, of module No. 3; etc.

As previously explained, each of the data bit signals D01–D28 and the NOT data bit signals are at UP-/DOWN levels that are compatible to the ON/OFF response levels of the appropriate inputs D1–D10 and their NOT counterparts to which they are applied. The residue bit signals on the other hand by virtue of the interconnection of the output stage and last bank in each of the modules 100, 200, 300 are provided by the particular module at substantially compatible levels to the inputs of the last bank of the next successive module as is apparent to those skilled in the art.

In operation, it can be shown that in response to the data bits D01–D28, the array of FIG. 1 provides at its outputs R0, R1 and R2, cf. module No. 9, a bit pattern which is indicative of the mod-3 residue value of the numerical value of the input data bits. Table No. 9 below is a partial truth table for the first three modules Nos. 1–3 of the array of FIG. 1. Table No. 9 indicates the decimal number DEC and its corresponding residue mod-3 decimal value Rd, the corresponding bit pattern for the first ten signal bits D01–D10 for the decimal number DEC., and the resulting corresponding current paths associated with the respective outputs/output resistors 1R0–1R2/151–153 of module No. 1, outputs-/output resistors 2R0–2R2/251–253 of module No. 2 and outputs/output resistors 3R0–3R2/351–353 of module No. 3. Accordingly, the corresponding output residue bit pattern can be derived from table No. 9, the absence of current in the particular output resistor being a 1 and the presence of current in each of the other two output resistors being a 0, as previously explained. In Table No. 9, for sake of clarity, every sixteenth number in the decimal sequence 0 to 1024 is separated by a continuous dash line. Moreover, a single x . . . x is used to indicate the missing data in a particular sixteen number sequence, and double x . . . x lines are used to indicate one or more missing sixteen number sequences. Using the Table No. 9 in conjunction with Tables No. 2–8, one can extrapolate the missing data and/or expand the data of Table No. 9 to include all the modules Nos. 1–9.

By way of example, assume the decimal number is 723. Accordingly, the data bit pattern for signal bits D01–D10 is 1100101101, respectively, and the remainder of the bits D11–D28 are 0s. Referring to Table Nos. 2 and 3, the bit pattern 1100 (=DEC 3) of the first four signal bits D01–D04 to respective inputs D1–D4 results in the current paths A07 and A08 in module No. 1 and a residue bit pattern 100 at its outputs 1R0, 1R1, 1R2, respectively, which is indicative of the decimal value of the mod-3 residue Rd=0 for the decimal number 3 represented by the bit pattern 1100 at the inputs of module No. 1.

The bit pattern 101 (=DEC 5) of the next three signal bits D05–D07 and the bit pattern 100 of the residue bits of module No. 1, which are fed to the respective inputs D5–D7 and 1R0–1R2 of module No. 2, result in the current paths B31 and B32 in module No. 2 and a residue bit pattern 001 at its outputs 2R0, 2R1, 2R2, respectively, cf. Tables Nos. 4 and 5. It should be noted that at this point the residue bit pattern 001 at the outputs of module No. 2 represents the mod-3 residue Rd=2 of the binary bits D01–D07, i.e. 1100101=decimal 83.

The bit pattern 101 (=DEC 5) of signal bits D08–D10 and the bit pattern 001 of the residue bits of module No. 2, which are fed to the respective inputs D8–D10 and 2R0–2R2 of module No. 3, result in the current paths C35 and C36 in module No. 3 and a residue bit pattern 100 at its outputs 3R0, 3R1, 2R2, respectively, cf. Tables Nos. 6 and 7. It should be noted that at this point the residue bit pattern 100 at the outputs of module No. 3 represents the mod-3 residue Rd=0 of the binary bits D01–D10, i.e. 110010101=decimal 723. Since the remainder of the bits D11–D28 are 0 bits, each of the remaining modules Nos. 4–9, are condition by the same data bit pattern 000 at their respective data inputs D5–D7 for modules 200 and D8–D10 for modules 300 and the same residue bit pattern 100 at their respective inputs 1R0–1R2 for modules 200 and 2R0–2R2 for modules 300. Thus, modules Nos. 4, 6 and 8 for a data bit pattern 000 and residue bit pattern 100 at their respective inputs D5–D7 and 1R0–1R2 results in a residue bit pattern of 1 0 0 at each of their outputs 2R0, 2R1, 2R2, respectively, and the current paths B01 and B02, respectively, cf. Tables Nos. 4 and 5. Likewise, modules Nos. 5, 7 and 9 for a data bit pattern 0 0 0 and residue bit pattern 1 0 0 at their respective inputs D8–D10 and 2R0–2R2 results in a residue bit pattern 1 0 0 at each of their outputs 3R0, 3R1, 3R2, respectively, and the current paths C01 and C02, respectively, cf. Tables Nos. 6 and 7.

It should be noted that at this point the residue bit pattern 1 0 0 at the outputs of each of the modules Nos. 4–9 represents the mod-3 residue Rd=0 of all the binary bits present at the inputs of the particular module and all preceding modules thereto. Accordingly, at the outputs R0, R1 and R2, the proper residue bit pattern 1 0 0 is provided in response to the numerical value, i.e. decimal 723, of the input signal D01–D28.

FIG. 2 ARRAY

Referring now to FIGS. 2, 3, 6 and 7, in the embodiment thereof, the residue bits of each module of the array are fed in parallel to the next successive module in the array.

For the twenty-eight bit input signal, the array of FIG. 1 has ten modules designated Nos. 1 to 10. More particularly, the array of FIG. 2 has seven modules 100, Nos. 1–7, which receive the data bit signals D01–D28, and three modules 400, Nos. 8-10, which the residue bit signals from the preceding modules in the array. More particularly, module No. 1 receives the first four low order data bit signals D01-D04 at its inputs D1-D4, respectively, module No. 2 receives the next four successive higher order data bit signals D05-D08 at its inputs D1-D4, respectively; module No. 3 receives the next four higher order data bit signals D08-D12 at its inputs D1-D4, respectively; and so forth. Module No. 8 receives at the respective inputs 1R0-4R2 of its four banks 410-440 the output residue bit signals of modules Nos. 1-4, respectively; module No. 9 receives at the respective inputs 1R0-3R2 of its three banks 410-430 the output residue bit signals of modules Nos. 5-7; and module No. 10 receives at the respective inputs 1R0-2R2 of its two banks 410-420 the output residue bit signals of modules Nos. 8 and 9, respectively.

As previously explained, each of the data bit signals D01-D28 and the NOT data bit signals are at UP/-DOWN levels that are compatible to the ON/OFF response levels of the appropriate inputs D1-D4 and NOT inputs to which they are applied. The residue bit signals of modules Nos. 1-3 and of modules 5-7 on the other hand must be shifted by appropriate level shifters 500 to be compatible with the signal response levels of the inputs of the banks 410-430, respectively, of the modules Nos. 8 and 9 to which they are fed, respectively. Likewise, the residue bit signal at the respective outputs 40-42 of modules Nos. 8 and 9 must be shifted by appropriate level shifters 500 to be compatible with the signal response levels of the inputs of banks 410 and 420, respectively, of module No. 10 to which they are applied. However, the residue bit signals of module No. 4 on the other hand by virtue of the interconnection of its output stage 150 and last bank 140 are provided by the module No. 4 at substantially compatible levels to the inputs 4R0-4R2 of the last bank 440 of the next successive module No. 8 to which they are fed as is apparent to those skilled in the art. Inputs which are not used in modules Nos. 9 and 10 are biased at appropriate levels to that they are condition to coact with the other residue bit signal receiving inputs to provide the appropriate pair of circuit paths in their respective outputs as will become apparent hereinafter.

Figure 7:
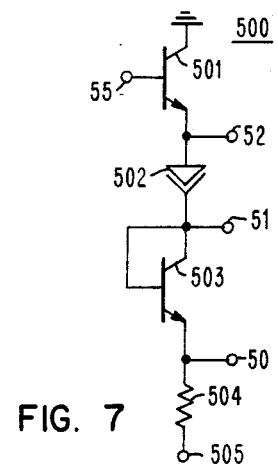
FIG. 7 is a detailed schematic diagram of a preferred embodiment of the circuit block types 500 shown in FIG. 2.

Referring to FIG. 7, there is shown a preferred level shifter 500 for the array embodiment of FIG. 2 which uses semiconductor devices compatible to those of the modules 100 and 400 thereof. It includes the following series connected elements, to wit: the collector-grounded emitter follower NPN transistor 501, Schottky diode 502, diode configured NPN transistor 503, resistor 504, and supply terminal 505. Outputs 50, 51 and 52 are connected to the junction of the emitter of transistor 503 and resistor 504, the junction of the cathode of diode 502 and commonly connected base and collector of transistor 503, and the junction of the emitter of transistor 501 and anode of diode 502, respectively. The supply terminal 505 is biased at the aforementioned negative voltage V used at the terminals S of modules 100, 400 of the array.

For the aforementioned typical voltage V = −4.25 v and in response to an UP level of zero volts of an input signal at terminal 55, conduction takes place thru the aforedescribed series connected elements 501-505, and the outputs 50, 51 and 52 are substantially at compatible ON response levels −2.2 v, −1.4 v, and −0.8 v, respectively, of the banks 410, 420, and 430, respectively, of a module 400, cf. Table No. 1. However, with V = −4.25 and in response to a DOWN level of −0.3 volts of an input signal at terminal 55, conduction takes place thru the aforedescribed series connected elements 501-505, and the outputs 50, 51 and 52 are substantially at compatible OFF response levels −2.5 v, −1.7 v, and −1.1 v, respectively, of the banks 410, 420, and 430, respectively, of a module 400, cf. Table No. 1.

For those residue inputs of the bank of a module 400 which are not used, i.e. not connected either directly or thru level shifters to the outputs of a module 100 or 400, as the case might be, the inputs of the particular bank are masked with a bit pattern 1 0 0 by appropriate voltages. Thus, for the twenty eight bit signal D01-D28, all the inputs 1R0-1R2 to 4R0-4R2 of the four banks 410 to 440 of module No. 8 are used, only the inputs 1R0-1R2 to 3R0-3R2 of banks 410 to 430 of module No. 9 are used, and only the inputs 1R0-1R2 and 2R0-2R2 of module No. 10 are used in the array of FIG. 2, and the non-used inputs masked with the bit pattern 1 0 0. For this end, input 4R0 in the last bank 440 of each of the modules Nos. 9 and 10 is connected to ground, which places it in a 1 or UP level, i.e. ON level, and the other two inputs 4R1 and 4R2 of modules Nos. 9 and 10 are biased by the aforementioned V level which forces them to 0 or DOWN, i.e. OFF, levels. The input 3R0 of the third bank 430 of module No. 10 is connected to a level shifter 500 which is grounded at its input 55 forcing the latter to a 1 or up level and the output 52 thereof at a corresponding 1 or up level. The other two inputs 3R1 and 3R2 of module No. 10 are biased by the aforementioned V level which forces them to 0 or DOWN levels.

In operation, it can be shown with the aid of Table Nos. 2, 3 and 8 that in response to the data bits D01-D28 the array of FIG. 2 provides at its outputs R0, R1 and R2, i.e. outputs 40, 41 and 42 of module No. 10, a bit pattern which is indicative of the mod-3 residue value of the numerical value of the input data bits.

By way of example assume again the decimal number is 723. Accordingly, the data bit pattern for signal bits D01-D10 is 1100101101, respectively, and the remainder of the bits D11 to D28 are 0s. Referring to Table Nos. 2 and 3, the bit pattern 1 1 0 0 (=DEC 3) of the first four signal bits D01-D04 to respective inputs D1-D4 results in the current paths A07 and A08 in module No. 1 and a residue bit pattern 1 0 0 at the outputs 1R0, 1R1, 1R2, respectively, of module No. 1 which is indicative of the decimal value of the mod-3 residue Rd=0 for the decimal number 3 represented by the bit pattern 1 1 0 0 at the inputs of module No. 1.

The bit pattern 1 0 1 1 (=DEC 13) of the next four signal bits D05-D8 which are fed to the respective inputs D1-D4 of module No. 2, result in the current paths A27 and A28 in module No. 2 and a residue bit pattern 0 1 0 at its outputs 1R0, 1R1, 1R2, respectively, cf. Tables Nos. 2 and 3. It should be noted that the residue bit pattern 0 1 0 at the outputs of module No. 2 represents the mod-3 residue Rd=1 of the binary bits D05-D08.

The bit pattern 0 1 0 0 (=DEC 2) of signal bits D09-D12, which are fed to the respective inputs D1-D4 of module No. 3, result in the current paths A05 and A06 in module No. 3 and a residue bit pattern 0 0 1 at its outputs 1R0, 1R1, 1R2, respectively, cf. Tables Nos. 2 and 3. It should be noted at this point, the residue bit pattern 0 0 1 at the outputs 1R0, 1R1, 1R2 of module No. 3 represents the mod-3 residue Rd=2 of the binary bits D09-D12.

Since the remainder of the bits D11–D28 are 0 bits, each of the remaining modules Nos. 4–9 are condition by the same four data bit pattern 0 0 0 0 (=DEC 0) at their respective data inputs D1–D4 and results in a residue bit pattern of 1 0 0 at each of their outputs 1R0, 1R1, 1R2, respectively, and the current paths A01 and A02, respectively, cf. Tables Nos. 2 and 3, which is indicative of the decimal value of the mod-3 residue Rd=0 for the decimal number 0 represented by the bit pattern 0 0 0 0 at the inputs of module Nos. 4–9.

Accordingly, the bit patterns at inputs 1R1–1R2, 2R1–2R2, 3R1–3R, 4R1–4R2 of module No. 8 are 1 0 0, 0 1 0, 0 0 1, 1 0 0, respectively, and the bit patterns at inputs module No. 9 are 1 0 0, 1 0 0, 1 0 0, 1 0 0. Referring to Table No. 8, the input bit pattern to module No. 8 results in an output bit pattern 1 0 0 at its outputs 40, 41 and 42, respectively. Also, the input bit pattern to module No. 9 results in an output pattern 1 0 0 at its outputs 40, 41, 42, respectively. It should be noted that the residue bit pattern 1 0 0 at the outputs 40, 41, 42 of module No. 8 represents the mod-3 residue Rd=0 of the binary bits D01–D15=DEC 723, and that the residue bit pattern 1 0 0 at the outputs 40, 41, 42 of module No. 9 represents the mod-3 residue Rd=0 of the binary bits D01–D15=DEC 0.

As a result, the bit patterns at inputs 1R1–1R2, 2R1–2R2, 3R1–3R, 4R1–4R2 of module No. 10 are 1 0 0, 1 0 0, 1 0 0, 1 0 0, respectively. Again referring to Table No. 8, this last mentioned bit pattern results in an output residue pattern 1 0 0 at the outputs 40, 41 and 42, respectively, of module No. 10, which are also the array outputs R0, R1, and R2, respectively, the output residue pattern 1 0 0 being indicative of the residue Rd=0 for the signal bit input D01–D28, i.e. decimal number 723.

The circuit elements, exclusive of the input stage 401, of each of the two conducting paths of each of the modules Nos. 8 to 10 for the respective input residue signal bit patterns which result from the assumed example, i.e. DEC=723, are indicated in Table No. 10 below. Referring to table No. 10, thus, in accordance with the aforedescribed convention, for the given assumptions, current is absent in resistor 451 and present in each of the resistors 452 and 453 indicating a bit pattern 1 0 0 at the outputs 40, 41 and 42, respectively, indicative a mod-3 Rd=0 for each of the modules Nos. 8–10. As aforementioned, there are 162 different circuit path combinations in a module 400, i.e. a pair for each of the 81 possible input bit combinations, but only two bit patterns and their respective corresponding pairs of current paths have been described for sake of brevity. However, as is apparent to those skilled in the art, the other 79 input signal bit combinations and the circuit path elements for each of the associated 79 pairs of circuit paths corresponding to each of the other 79 input signal bits can be readily derived and correlated with the input data bit combinations D01–D28 to the array of FIG. 2.

By way of comparison with the aforedescribed prior art circuit for generating mod-3 residues of a twenty-eight bit number, it can be shown that by implementing the embodiment of FIG. 1 for an equivalent bit number, the number of stages of delay is reduced to nine, i.e. one for each of the nine modules Nos. 1–9, and there is thus a concomitant reduction in the circuitry and power. Likewise, it can be shown that implementing the embodiment of FIG. 2 for the equivalent bit number there is also a concomitant reduction in circuitry, power and delay.

The arrays of FIGS. 1 and 2 have been described by way of example as accepting a twenty-eight bit number. It should be understood that the arrays can be expanded or contracted to accept more or less, respectively, data bits of a higher or lower, respectively, bit number by adding or reducing the number of appropriate modules and/or by biasing the unused higher order bit inputs to DOWN or 0 levels in the case where a lower bit number is being processed which is less that the number of data bit inputs of the array.

Also, while the array embodiments have been described with all the modules having the same number of banks, and for generating mod-3 residues, and as using NPN semiconductors, it should be understood that the invention can be practiced with modules having other plural same or different numbers of banks, and/or for generating other higher odd number modulus residues, and/or using PNP semiconductors and/or other types of semiconductor devices. Moreover, as is apparent to those skilled in the art, while the invention has been described with bit convention where an UP level represents a binary 1 and a DOWN level represents a binary 0, and with a current condition pattern in the resistors of the output stage of a module where current is absent in the output resistor which corresponds to the true residue value and is present in the other output resistors of the output stage, that the invention can be practiced with other conventions such as where an UP level represents a binary 0 and a DOWN level represents a binary 1, and/or current is present exclusively in the output resistor which corresponds to the true residue value and is absent in all the other output resistors.

Also, for sake of simplicity and explanation, the embodiments have been described with the data bits being applied in consecutive order to consecutive data receiving inputs of consecutive modules. In particular, in modules Nos. 1–9 of the embodiment of FIG. 1, the first four low order to high order bits D01–D04 are applied consecutively to the four consecutive inputs D1–D4 of module No. 1; the next three low order to high order bits D05–D07 are applied consecutively to the inputs D5–D7 of the first to penultimate banks 210–230, respectively, of module No. 2; the next three low order to high order bits D08–D10 are applied consecutively to the inputs D8–D10 of the first to penultimate banks 310–330, respectively, of module No. 3; the next three low order to high order bits D11–D12 are applied consecutively to the inputs D5–D7 of the first to penultimate banks 210–230, respectively, of module No. 4; and so forth. In modules Nos. 1–7 of the embodiment of FIG. 2, the first four low order to high order bits D01–D04 are applied consecutively to the four consecutive inputs D1–D4 of module No. 1; the next four low order to high order bits D05–D08 are applied consecutively to the inputs D1–D4 of the first consecutive inputs D1–D4 of module No. 2; and so forth. It should be noted that for binary 1 bits in the even order positions, i.e. those corresponding with the weights associated with the even exponentials 0, 2, 4, etc. of the base two, the mod-3 residue remainder is always a one; whereas, for binary 1 bits in the odd order positions, i.e. those corresponding with the weights associated with the odd exponentials 1, 3, 5, etc., the mod-3 residue remainder is always a two; and for a binary two; and for a binary 0 bit in any order position, the mod-3 residue remainder is always a zero. Consequently, each data bit signal associated with any of the even order positions may be interchanged with any other even order data bit signal and applied to the input thereof with an appropriate level shift adjustment, if required. For example, in FIG. 1, the data bit signals D08 and D02 can be interchanged so that signals D02 and D08 are applied to input D9 of module No. 3 and input D2 of module No. 1, respectively. In this particular example, no level shifting is required because the signals D02 and D08 are being applied to inputs of banks of the same rank. Likewise, each data bit signal associated with any of the odd order positions may be interchanged with any other odd order data bit signal and applied to the input thereof, e.g. the data bit signals D05 and D07 can be interchanged so that signals D05 and D07 are applied to inputs D7 and D5, respectively, of module No. 2. In this particular example, signals D05 and D07 would be shifted to be compatible with the response level of the inputs to which they are being applied. It can readily shown that the mod-3 residue bit pattern resulting at the array outputs R0–R2 of the array, nevertheless, is indicative of the value of the composite data signal D01–D28 when such interchanges are made. Thus, the invention can be practiced with the data bit signals being applied out of sequence, i.e. non-consecutively, to the inputs of the array. As such, the invention has a high degree of wiring options or wiring flexibility.

Moreover, the particular embodiment of FIG. 2, has been described with a substantially symmetrical array in that the modules Nos. 8 and 9 are fed to the inputs of module No. 10. It can be readily shown, however, that the respective sets of outputs 1R0–1R2 of modules Nos. 5–7 may be fed through appropriate level shifters, such as the type 500, directly to the inputs 2R0–2R2, 3R0–3R2 and 4R0–4R2, respectively, of module No. 10, thereby obviating the need for module No. 9.

Thus, while the invention has been described with reference to preferred embodiments thereof, it will be understood by those skilled in the art that various changes in form and details may be made without departing from the scope of the invention.

TABLE NO. 2

APPENDIX

| D1 | D2 | D3 | D4 | Path | Circuit Elements |
|---|---|---|---|---|---|
| 0 | 0 | 0 | 0 | A01 | 111B-122B-132B-143B-152 |
| 0 | 0 | 0 | 0 | A02 | 111B-122B-132B-144B-153 |
| 1 | 0 | 0 | 0 | A03 | 111A-121B-133B-141B-151 |
| 1 | 0 | 0 | 0 | A04 | 111A-121B-133B-142B-153 |
| 0 | 1 | 0 | 0 | A05 | 111B-122A-131B-146B-151 |
| 0 | 1 | 0 | 0 | A06 | 111B-122A-131B-145B-152 |
| 1 | 1 | 0 | 0 | A07 | 111A-121A-132B-143B-152 |
| 1 | 1 | 0 | 0 | A08 | 111A-121A-132B-144B-153 |
| 0 | 0 | 1 | 0 | A09 | 111B-122B-132A-141B-151 |
| 0 | 0 | 1 | 0 | A10 | 111B-122B-132A-142B-153 |
| 1 | 0 | 1 | 0 | A11 | 111A-121B-133A-146B-151 |
| 1 | 0 | 1 | 0 | A12 | 111A-121B-133A-145B-152 |
| 0 | 1 | 1 | 0 | A13 | 111B-122A-131A-143B-152 |
| 0 | 1 | 1 | 0 | A14 | 111B-122A-131A-144B-153 |
| 1 | 1 | 1 | 0 | A15 | 111A-121A-132A-141B-151 |
| 1 | 1 | 1 | 0 | A16 | 111A-121A-132A-142B-153 |
| 0 | 0 | 0 | 1 | A17 | 111B-122B-132B-143A-151 |
| 0 | 0 | 0 | 1 | A18 | 111B-122B-132B-144A-152 |
| 1 | 0 | 0 | 1 | A19 | 111A-121B-133B-141A-152 |
| 1 | 0 | 0 | 1 | A20 | 111A-121B-133B-142A-153 |
| 0 | 1 | 0 | 1 | A21 | 111B-122A-131B-145A-151 |
| 0 | 1 | 0 | 1 | A22 | 111B-122A-131B-146A-153 |
| 1 | 1 | 0 | 1 | A23 | 111A-121A-132B-143A-151 |
| 1 | 1 | 0 | 1 | A24 | 111A-121A-132B-144A-152 |
| 0 | 0 | 1 | 1 | A25 | 111B-122B-132A-141A-152 |
| 0 | 0 | 1 | 1 | A26 | 111B-122B-132A-142A-153 |
| 1 | 0 | 1 | 1 | A27 | 111A-121B-133A-145A-151 |
| 1 | 0 | 1 | 1 | A28 | 111A-121B-133A-146A-153 |
| 0 | 1 | 1 | 1 | A29 | 111B-122A-131A-143A-151 |
| 0 | 1 | 1 | 1 | A30 | 111B-122A-131A-144A-152 |

TABLE NO. 2-continued

APPENDIX

| D1 | D2 | D3 | D4 | Path | Circuit Elements |
|---|---|---|---|---|---|
| 1 | 1 | 1 | 1 | A31 | 111A-121A-132A-141A-152 |
| 1 | 1 | 1 | 1 | A32 | 111A-121A-132A-142A-153 |

TABLE NO. 3

| DEC | Rd | D1 | D2 | D3 | D4 | 1R0 151 | 1R1 152 | 1R2 153 |
|---|---|---|---|---|---|---|---|---|
| 0000 | 0 | 0 | 0 | 0 | 0 | — | A01 | A02 |
| 0001 | 1 | 1 | 0 | 0 | 0 | A03 | — | A04 |
| 0002 | 2 | 0 | 1 | 0 | 0 | A05 | A06 | — |
| 0003 | 0 | 1 | 1 | 0 | 0 | — | A07 | A08 |
| 0004 | 1 | 0 | 0 | 1 | 0 | A09 | — | A10 |
| 0005 | 2 | 1 | 0 | 1 | 0 | A11 | A12 | — |
| 0006 | 0 | 0 | 1 | 1 | 0 | — | A13 | A14 |
| 0007 | 1 | 1 | 1 | 1 | 0 | A15 | — | A16 |
| 0008 | 2 | 0 | 0 | 0 | 1 | A17 | A18 | — |
| 0009 | 0 | 1 | 0 | 0 | 1 | — | A19 | A20 |
| 0010 | 1 | 0 | 1 | 0 | 1 | A21 | — | A22 |
| 0011 | 2 | 1 | 1 | 0 | 1 | A23 | A24 | — |
| 0012 | 0 | 0 | 0 | 1 | 1 | — | A25 | A26 |
| 0013 | 1 | 1 | 0 | 1 | 1 | A27 | — | A28 |
| 0014 | 2 | 0 | 1 | 1 | 1 | A29 | A30 | — |
| 0015 | 0 | 1 | 1 | 1 | 1 | — | A31 | A32 |

TABLE NO. 4

| D5 | D6 | D7 | 1R | Path | Circuit Elements |
|---|---|---|---|---|---|
| 0 | 0 | 0 | 0 | B01 | 211B-222B-232B-241B-252 |
| 0 | 0 | 0 | 0 | B02 | 211B-222B-232B-242B-253 |
| 0 | 0 | 0 | 1 | B03 | 211B-222B-232B-244B-251 |
| 0 | 0 | 0 | 1 | B04 | 211B-222B-232B-243B-253 |
| 0 | 0 | 0 | 2 | B05 | 211B-222B-232B-246B-251 |
| 0 | 0 | 0 | 2 | B06 | 211B-222B-232B-245B-252 |
| 1 | 0 | 0 | 0 | B07 | 211A-221A-231B-242A-251 |
| 1 | 0 | 0 | 0 | B08 | 211A-221A-231B-241A-253 |
| 1 | 0 | 0 | 1 | B09 | 211A-221A-231B-244A-251 |
| 1 | 0 | 0 | 1 | B10 | 211A-221A-231B-243A-252 |
| 1 | 0 | 0 | 2 | B11 | 211A-211A-231B-245A-252 |
| 1 | 0 | 0 | 2 | B12 | 211A-221A-231B-246A-253 |
| 0 | 1 | 0 | 0 | B13 | 211B-222A-233B-241C-251 |
| 0 | 1 | 0 | 0 | B14 | 211B-222A-233B-242C-252 |
| 0 | 1 | 0 | 1 | B15 | 211B-222A-233B-243C-252 |
| 0 | 1 | 0 | 1 | B16 | 211B-222A-233B-244C-253 |
| 0 | 1 | 0 | 2 | B17 | 211B-222A-233B-246C-251 |
| 0 | 1 | 0 | 2 | B18 | 211B-222A-233B-245C-253 |
| 1 | 1 | 0 | 0 | B19 | 211A-221A-232B-241B-252 |
| 1 | 1 | 0 | 0 | B20 | 211A-221A-232B-242B-253 |
| 1 | 1 | 0 | 1 | B21 | 211A-221A-232B-244B-251 |
| 1 | 1 | 0 | 1 | B22 | 211A-221A-232B-243B-253 |
| 1 | 1 | 0 | 2 | B23 | 211A-221A-232B-246B-251 |
| 1 | 1 | 0 | 2 | B24 | 211A-221A-232B-245B-252 |
| 0 | 0 | 1 | 0 | B25 | 211B-222B-232A-242A-251 |
| 0 | 0 | 1 | 0 | B26 | 211B-222B-232A-241A-253 |
| 0 | 0 | 1 | 1 | B27 | 211B-222B-232A-244A-251 |
| 0 | 0 | 1 | 1 | B28 | 211B-222B-232A-243A-252 |
| 0 | 0 | 1 | 2 | B29 | 211B-222B-232A-245A-252 |
| 0 | 0 | 1 | 2 | B30 | 211B-222B-232A-246A-253 |
| 1 | 0 | 1 | 0 | B31 | 211A-221B-231A-241C-251 |
| 1 | 0 | 1 | 0 | B32 | 211A-221B-231A-242C-252 |
| 1 | 0 | 1 | 1 | B33 | 211A-221B-231A-243C-252 |
| 1 | 0 | 1 | 1 | B34 | 211A-221B-231A-244C-253 |
| 1 | 0 | 1 | 2 | B35 | 211A-221B-231A-246C-251 |
| 1 | 0 | 1 | 2 | B36 | 211A-221B-231A-245C-253 |
| 0 | 1 | 1 | 0 | B37 | 211B-222A-233A-241B-252 |
| 0 | 1 | 1 | 0 | B38 | 211B-222A-233A-242B-253 |
| 0 | 1 | 1 | 1 | B39 | 211B-222A-233A-244B-251 |
| 0 | 1 | 1 | 1 | B40 | 211B-222A-233A-243B-253 |
| 0 | 1 | 1 | 2 | B41 | 211B-222A-233A-246B-251 |
| 0 | 1 | 1 | 2 | B42 | 211B-222A-233A-245B-252 |
| 1 | 1 | 1 | 0 | B43 | 211A-221A-232A-242A-251 |
| 1 | 1 | 1 | 0 | B44 | 211A-221A-232A-241A-253 |
| 1 | 1 | 1 | 1 | B45 | 211A-221A-232A-244A-251 |
| 1 | 1 | 1 | 1 | B46 | 211A-221A-232A-243A-252 |
| 1 | 1 | 1 | 2 | B47 | 211A-221A-232A-245A-252 |

TABLE NO. 4-continued

| D5 | D6 | D7 | 1R | Path | Circuit Elements |
|---|---|---|---|---|---|
| 1 | 1 | 1 | 2 | B48 | 211A-221A-232A-246A-253 |

TABLE NO. 5

| D5 | D6 | D7 | 1R0 | 1R1 | 1R2 | 2R0 251 | 2R1 252 | 2R2 253 |
|---|---|---|---|---|---|---|---|---|
| 0 | 0 | 0 | 1 | 0 | 0 | — | B01 | B02 |
| 0 | 0 | 0 | 0 | 1 | 0 | B03 | — | B04 |
| 0 | 0 | 0 | 0 | 0 | 1 | B05 | B06 | — |
| 1 | 0 | 0 | 1 | 0 | 0 | B07 | — | B08 |
| 1 | 0 | 0 | 0 | 1 | 0 | B09 | B10 | — |
| 1 | 0 | 0 | 0 | 0 | 1 | — | B11 | B12 |
| 0 | 1 | 0 | 1 | 0 | 0 | B13 | B14 | — |
| 0 | 1 | 0 | 0 | 1 | 0 | — | B15 | B16 |
| 0 | 1 | 0 | 0 | 0 | 1 | B17 | — | B18 |
| 1 | 1 | 0 | 1 | 0 | 0 | — | B19 | B20 |
| 1 | 1 | 0 | 0 | 1 | 0 | B21 | — | B22 |
| 1 | 1 | 0 | 0 | 0 | 1 | B23 | B24 | — |
| 0 | 0 | 1 | 1 | 0 | 0 | B25 | — | B26 |
| 0 | 0 | 1 | 0 | 1 | 0 | B27 | B28 | — |
| 0 | 0 | 1 | 0 | 0 | 1 | — | B29 | B30 |
| 1 | 0 | 1 | 1 | 0 | 0 | B31 | B32 | — |
| 1 | 0 | 1 | 0 | 1 | 0 | — | B33 | B34 |
| 1 | 0 | 1 | 0 | 0 | 1 | B35 | — | B36 |
| 0 | 1 | 1 | 1 | 0 | 0 | — | B37 | B38 |
| 0 | 1 | 1 | 0 | 1 | 0 | B39 | — | B40 |
| 0 | 1 | 1 | 0 | 0 | 1 | B41 | B42 | — |
| 1 | 1 | 1 | 1 | 0 | 0 | B43 | — | B44 |
| 1 | 1 | 1 | 0 | 1 | 0 | B45 | B46 | — |
| 1 | 1 | 1 | 0 | 0 | 1 | — | B47 | B48 |

TABLE NO. 6

| D8 | D9 | D10 | 2R | Path | Circuit Elements |
|---|---|---|---|---|---|
| 0 | 0 | 0 | 0 | C01 | 311B-322B-332B-341B-352 |
| 0 | 0 | 0 | 0 | C02 | 311B-322B-332B-342B-353 |
| 0 | 0 | 0 | 1 | C03 | 311B-322B-332B-344B-351 |
| 0 | 0 | 0 | 1 | C04 | 311B-322B-332B-343B-353 |
| 0 | 0 | 0 | 2 | C05 | 311B-322B-332B-346B-351 |
| 0 | 0 | 0 | 2 | C06 | 311B-322B-332B-345B-352 |
| 1 | 0 | 0 | 0 | C07 | 311A-321B-331B-341C-351 |
| 1 | 0 | 0 | 0 | C08 | 311A-321B-331B-342C-352 |
| 1 | 0 | 0 | 1 | C09 | 311A-321B-331B-343C-352 |
| 1 | 0 | 0 | 1 | C10 | 311A-321B-331B-344C-353 |
| 1 | 0 | 0 | 2 | C11 | 311A-321B-331B-346C-351 |
| 1 | 0 | 0 | 2 | C12 | 311A-321B-331B-345C-353 |
| 0 | 1 | 0 | 0 | C13 | 311B-322A-333B-342A-351 |
| 0 | 1 | 0 | 0 | C14 | 311B-322A-333B-341A-353 |
| 0 | 1 | 0 | 1 | C15 | 311B-322A-333B-344A-351 |
| 0 | 1 | 0 | 1 | C16 | 311B-322A-333B-343A-352 |
| 0 | 1 | 0 | 2 | C17 | 311B-322A-333B-345A-352 |
| 0 | 1 | 0 | 2 | C18 | 311B-322A-333B-346A-353 |
| 1 | 1 | 0 | 0 | C19 | 311A-321A-332B-341B-352 |
| 1 | 1 | 0 | 0 | C20 | 311A-321A-332B-342B-353 |
| 1 | 1 | 0 | 1 | C21 | 311A-321A-332B-344B-351 |

TABLE NO. 6-continued

| D8 | D9 | D10 | 2R | Path | Circuit Elements |
|---|---|---|---|---|---|
| 1 | 1 | 0 | 1 | C22 | 311A-321A-332B-343B-353 |
| 1 | 1 | 0 | 2 | C23 | 311A-321A-332B-346B-351 |
| 1 | 1 | 0 | 2 | C24 | 311A-321A-332B-345B-352 |
| 0 | 0 | 1 | 0 | C25 | 311B-322B-332A-341C-351 |
| 0 | 0 | 1 | 0 | C26 | 311B-322B-332A-342C-352 |
| 0 | 0 | 1 | 1 | C27 | 311B-322B-332A-343C-352 |
| 0 | 0 | 1 | 1 | C28 | 311B-322B-332A-344C-353 |
| 0 | 0 | 1 | 2 | C29 | 311B-322B-332A-346C-351 |
| 0 | 0 | 1 | 2 | C30 | 311B-322B-332A-345C-353 |
| 1 | 0 | 1 | 0 | C31 | 311A-321B-331A-342A-351 |
| 1 | 0 | 1 | 0 | C32 | 311A-321B-331A-341A-353 |
| 1 | 0 | 1 | 1 | C33 | 311A-321B-331A-344A-351 |
| 1 | 0 | 1 | 1 | C34 | 311A-321B-331A-343A-352 |
| 1 | 0 | 1 | 2 | C35 | 311A-321B-331A-345A-352 |
| 1 | 0 | 1 | 2 | C36 | 311A-321B-331A-346A-353 |
| 0 | 1 | 1 | 0 | C37 | 311B-322A-333A-341B-352 |
| 0 | 1 | 1 | 0 | C38 | 311B-322A-333A-342B-353 |
| 0 | 1 | 1 | 1 | C39 | 311B-322A-333A-344B-351 |
| 0 | 1 | 1 | 1 | C40 | 311B-322A-333A-343B-353 |
| 0 | 1 | 1 | 2 | C41 | 311B-322A-333A-346B-351 |
| 0 | 1 | 1 | 2 | C42 | 311B-322A-333A-345B-352 |
| 1 | 1 | 1 | 0 | C43 | 311A-321A-332A-341C-351 |
| 1 | 1 | 1 | 0 | C44 | 331A-321A-332A-342C-352 |
| 1 | 1 | 1 | 1 | C45 | 311A-321A-332A-343C-352 |
| 1 | 1 | 1 | 1 | C46 | 311A-321A-332A-344C-353 |
| 1 | 1 | 1 | 2 | C47 | 311A-321A-332A-346C-351 |
| 1 | 1 | 1 | 2 | C48 | 311A-321A-332A-345C-353 |

TABLE NO. 7

| D8 | D9 | D10 | 2R0 2R0 | 2R1 2R1 | 2R2 2R2 | 3R0 351 | 3R1 352 | 3R2 353 |
|---|---|---|---|---|---|---|---|---|
| 0 | 0 | 0 | 1 | 0 | 0 | — | C01 | C02 |
| 0 | 0 | 0 | 0 | 1 | 0 | C03 | — | C04 |
| 0 | 0 | 0 | 0 | 0 | 1 | C05 | C06 | — |
| 1 | 0 | 0 | 1 | 0 | 0 | C07 | C08 | — |
| 1 | 0 | 0 | 0 | 1 | 0 | — | C09 | C10 |
| 1 | 0 | 0 | 0 | 0 | 1 | C11 | — | C12 |
| 0 | 1 | 0 | 1 | 0 | 0 | C13 | — | C14 |
| 0 | 1 | 0 | 0 | 1 | 0 | C15 | C16 | — |
| 0 | 1 | 0 | 0 | 0 | 1 | — | C17 | C18 |
| 1 | 1 | 0 | 1 | 0 | 0 | — | C19 | C20 |
| 1 | 1 | 0 | 0 | 1 | 0 | C21 | — | C22 |
| 1 | 1 | 0 | 0 | 0 | 1 | C23 | C24 | — |
| 0 | 0 | 1 | 1 | 0 | 0 | C25 | C26 | — |
| 0 | 0 | 1 | 0 | 1 | 0 | — | C27 | C28 |
| 0 | 0 | 1 | 0 | 0 | 1 | C29 | — | C30 |
| 1 | 0 | 1 | 1 | 0 | 0 | C31 | — | C32 |
| 1 | 0 | 1 | 0 | 1 | 0 | C33 | C34 | — |
| 1 | 0 | 1 | 0 | 0 | 1 | — | C35 | C36 |
| 0 | 1 | 1 | 1 | 0 | 0 | — | C37 | C38 |
| 0 | 1 | 1 | 0 | 1 | 0 | C39 | — | C40 |
| 0 | 1 | 1 | 0 | 0 | 1 | C41 | C42 | — |
| 1 | 1 | 1 | 1 | 0 | 0 | C43 | C44 | — |
| 1 | 1 | 1 | 0 | 1 | 0 | — | C45 | C46 |
| 1 | 1 | 1 | 0 | 0 | 1 | C47 | — | C48 |

TABLE NO. 8

| 1R0 | 1R1 | 1R2 | 2R0 | 2R1 | 2R2 | 3R0 | 3R1 | 3R2 | (4R0 = 1) 40 | (4R0 = 1) 41 | (4R0 = 1) 42 | (4R1 = 1) 40 | (4R1 = 1) 41 | (4R1 = 1) 42 | (4R2 = 1) 40 | (4R2 = 1) 41 | (4R2 = 1) 42 |
|---|---|---|---|---|---|---|---|---|---|---|---|---|---|---|---|---|---|
| 1 | 0 | 0 | 1 | 0 | 0 | 1 | 0 | 0 | 1 | 0 | 0 | 0 | 1 | 0 | 0 | 0 | 1 |
| 0 | 1 | 0 | 1 | 0 | 0 | 1 | 0 | 0 | 0 | 1 | 0 | 0 | 0 | 1 | 1 | 0 | 0 |
| 0 | 0 | 1 | 1 | 0 | 0 | 1 | 0 | 0 | 0 | 0 | 1 | 1 | 0 | 0 | 0 | 1 | 0 |
| 1 | 0 | 0 | 0 | 1 | 0 | 1 | 0 | 0 | 0 | 1 | 0 | 0 | 0 | 1 | 1 | 0 | 0 |
| 0 | 1 | 0 | 0 | 1 | 0 | 1 | 0 | 0 | 0 | 0 | 1 | 1 | 0 | 0 | 0 | 1 | 0 |
| 0 | 0 | 1 | 0 | 1 | 0 | 1 | 0 | 0 | 1 | 0 | 0 | 0 | 1 | 0 | 0 | 0 | 1 |
| 1 | 0 | 0 | 0 | 0 | 1 | 1 | 0 | 0 | 0 | 0 | 1 | 1 | 0 | 0 | 0 | 1 | 0 |
| 0 | 1 | 0 | 0 | 0 | 1 | 1 | 0 | 0 | 1 | 0 | 0 | 0 | 1 | 0 | 0 | 0 | 1 |
| 0 | 0 | 1 | 0 | 0 | 1 | 1 | 0 | 0 | 0 | 1 | 0 | 0 | 0 | 1 | 1 | 0 | 0 |
| 1 | 0 | 0 | 1 | 0 | 0 | 0 | 1 | 0 | 0 | 1 | 0 | 1 | 0 | 0 | 0 | 1 | 0 |
| 0 | 1 | 0 | 1 | 0 | 0 | 0 | 1 | 0 | 0 | 0 | 1 | 0 | 1 | 0 | 1 | 0 | 0 |
| 0 | 0 | 1 | 1 | 0 | 0 | 0 | 1 | 0 | 1 | 0 | 0 | 0 | 0 | 1 | 0 | 1 | 0 |
| 1 | 0 | 0 | 0 | 1 | 0 | 0 | 1 | 0 | 0 | 0 | 1 | 1 | 0 | 0 | 0 | 1 | 0 |
| 0 | 1 | 0 | 0 | 1 | 0 | 0 | 1 | 0 | 1 | 0 | 0 | 0 | 1 | 0 | 0 | 0 | 1 |
| 0 | 0 | 1 | 0 | 1 | 0 | 0 | 1 | 0 | 0 | 1 | 0 | 0 | 0 | 1 | 1 | 0 | 0 |

TABLE NO. 8-continued

| 1R0 | 1R1 | 1R2 | 2R0 | 2R1 | 2R2 | 3R0 | 3R1 | 3R2 | (4R0 = 1) 40 | 41 | 42 | (4R1 = 1) 40 | 41 | 42 | (4R2 = 1) 40 | 41 | 42 |
|---|---|---|---|---|---|---|---|---|---|---|---|---|---|---|---|---|---|
| 1 | 0 | 0 | 0 | 0 | 1 | 0 | 1 | 0 | 1 | 0 | 0 | 0 | 1 | 0 | 0 | 0 | 1 |
| 0 | 1 | 0 | 0 | 0 | 1 | 0 | 1 | 0 | 0 | 1 | 0 | 0 | 0 | 1 | 1 | 0 | 0 |
| 0 | 0 | 1 | 0 | 0 | 1 | 0 | 1 | 0 | 0 | 0 | 1 | 1 | 0 | 0 | 0 | 1 | 0 |
| 1 | 0 | 0 | 1 | 0 | 0 | 0 | 0 | 1 | 0 | 0 | 1 | 1 | 0 | 0 | 0 | 1 | 0 |
| 0 | 1 | 0 | 1 | 0 | 0 | 0 | 0 | 1 | 1 | 0 | 0 | 0 | 1 | 0 | 0 | 0 | 1 |
| 0 | 0 | 1 | 1 | 0 | 0 | 0 | 0 | 1 | 0 | 1 | 0 | 0 | 0 | 1 | 1 | 0 | 0 |
| 1 | 0 | 0 | 0 | 1 | 0 | 0 | 0 | 1 | 1 | 0 | 0 | 0 | 1 | 0 | 0 | 0 | 1 |
| 0 | 1 | 0 | 0 | 1 | 0 | 0 | 0 | 1 | 0 | 1 | 0 | 0 | 0 | 1 | 1 | 0 | 0 |
| 0 | 0 | 1 | 0 | 1 | 0 | 0 | 0 | 1 | 0 | 0 | 1 | 1 | 0 | 0 | 0 | 1 | 0 |
| 1 | 0 | 0 | 0 | 0 | 1 | 0 | 0 | 1 | 0 | 1 | 0 | 0 | 0 | 1 | 1 | 0 | 0 |
| 0 | 1 | 0 | 0 | 0 | 1 | 0 | 0 | 1 | 0 | 0 | 1 | 1 | 0 | 0 | 0 | 1 | 0 |
| 0 | 0 | 1 | 0 | 0 | 1 | 0 | 0 | 1 | 1 | 0 | 0 | 0 | 1 | 0 | 0 | 0 | 1 |

TABLE NO. 9

| DEC | Rd | DDDDDDDDDD 0000000001 1234567890 | 1R0 151 | 1R1 152 | 1R2 153 | 2R0 251 | 2R1 252 | 2R2 253 | 3R0 351 | 3R1 352 | 3R2 353 |
|---|---|---|---|---|---|---|---|---|---|---|---|
| 0000 | 0 | 0000000000 | — | A01 | A02 | — | B01 | B02 | — | C01 | C02 |
| 0001 | 1 | 1000000000 | A03 | — | A04 | B03 | — | B04 | C03 | — | C04 |
| 0002 | 2 | 0100000000 | A05 | A06 | — | B05 | B06 | — | C05 | C06 | — |
| 0003 | 0 | 1100000000 | — | A07 | A08 | — | B01 | B02 | — | C01 | C02 |
| 0004 | 1 | 0010000000 | A09 | — | A10 | B03 | — | B04 | C03 | — | C04 |
| 0005 | 2 | 1010000000 | A11 | A12 | — | B05 | B06 | — | C05 | C06 | — |
| 0006 | 0 | 0110000000 | — | A13 | A14 | — | B01 | B02 | — | C01 | C02 |
| 0007 | 1 | 1110000000 | A15 | — | A16 | B03 | — | B04 | C03 | — | C04 |
| 0008 | 2 | 0001000000 | A17 | A18 | — | B05 | B06 | — | C05 | C06 | — |
| 0009 | 0 | 1001000000 | — | A19 | A20 | — | B01 | B02 | — | C01 | C02 |
| 0010 | 1 | 0101000000 | A21 | — | A22 | B03 | — | B04 | C03 | — | C04 |
| 0011 | 2 | 1101000000 | A23 | A24 | — | B05 | B06 | — | C05 | C06 | — |
| 0012 | 0 | 0011000000 | — | A25 | A26 | — | B01 | B02 | — | C01 | C02 |
| 0013 | 1 | 1011000000 | A27 | — | A28 | B03 | — | B04 | C03 | — | C04 |
| 0014 | 2 | 0111000000 | A29 | A30 | — | B05 | B06 | — | C05 | C06 | — |
| 0015 | 0 | 1111000000 | — | A31 | A32 | — | B01 | B02 | — | C01 | C02 |
| 0016 | 1 | 0000100000 | — | A01 | A02 | B07 | — | B08 | C03 | — | C04 |
| 0017 | 2 | 1000100000 | A03 | — | A04 | B09 | B10 | — | C05 | C06 | — |
| 0018 | 0 | 0100100000 | A05 | A06 | — | — | B11 | B12 | — | C01 | C02 |
| 0019 | 1 | 1100100000 | — | A07 | A08 | B07 | — | B08 | C03 | — | C04 |
| 0020 | 2 | 0010100000 | A09 | — | A10 | B09 | B10 | — | C05 | C06 | — |
| 0021 | 0 | 1010100000 | A11 | A12 | — | — | B11 | B12 | — | C01 | C02 |
| 0022 | 1 | 0110100000 | — | A13 | A14 | B07 | — | B08 | C03 | — | C04 |
| 0023 | 2 | 1110100000 | A15 | — | A16 | B09 | B10 | — | C05 | C06 | — |
| 0024 | 0 | 0001100000 | A17 | A18 | — | — | B11 | B12 | — | C01 | C02 |
| 0025 | 1 | 1001100000 | — | A19 | A20 | B07 | — | B08 | C03 | — | C04 |
| 0026 | 2 | 0101100000 | A21 | — | A22 | B09 | B10 | — | C05 | C06 | — |
| 0027 | 0 | 1101100000 | A23 | A24 | — | — | B11 | B12 | — | C01 | C02 |
| 0028 | 1 | 0011100000 | — | A25 | A26 | B07 | — | B08 | C03 | — | C04 |
| 0029 | 2 | 1011100000 | A27 | — | A28 | B09 | B10 | — | C05 | C06 | — |
| 0030 | 0 | 0111100000 | A29 | A30 | — | — | B11 | B12 | — | C01 | C02 |
| 0031 | 1 | 1111100000 | — | A31 | A32 | B07 | — | B08 | C03 | — | C04 |
| 0032 | 2 | 0000010000 | — | A01 | A02 | B13 | B14 | — | C05 | C06 | — |
| x . | | . . . . . . . . . . | | | | | | | | | . x |
| 0047 | 2 | 1111010000 | — | A31 | A32 | B13 | B14 | — | C05 | C06 | — |
| 0048 | 0 | 0000110000 | — | A01 | A02 | — | B19 | B20 | — | C01 | C02 |
| x . | | . . . . . . . . . . | | | | | | | | | . x |
| 0063 | 0 | 1111110000 | — | A31 | A32 | — | B19 | B20 | — | C01 | C02 |
| 0064 | 1 | 0000001000 | — | A01 | A02 | B25 | — | B26 | C03 | — | C04 |
| x . | | . . . . . . . . . . | | | | | | | | | . x |
| 0079 | 1 | 1111001000 | — | A31 | A32 | B25 | — | B26 | C03 | — | C04 |
| 0080 | 2 | 0000101000 | — | A01 | A02 | B31 | B32 | — | C05 | C06 | — |
| x . | | . . . . . . . . . . | | | | | | | | | . x |
| 0095 | 2 | 1111101000 | — | A31 | A32 | B31 | B32 | — | C05 | C06 | — |
| 0096 | 0 | 0000011000 | — | A01 | A02 | — | B37 | B38 | — | C01 | C02 |
| x . | | . . . . . . . . . . | | | | | | | | | . x |
| 0111 | 0 | 1111011000 | — | A31 | A32 | — | B37 | B38 | — | C01 | C02 |
| 0112 | 1 | 0000111000 | — | A01 | A02 | B43 | — | B44 | C03 | — | C04 |
| 0113 | 2 | 1000111000 | A03 | — | A04 | B45 | B46 | — | C05 | C06 | — |
| 0114 | 0 | 0100111000 | A05 | A06 | — | — | B47 | B48 | — | C01 | C02 |
| 0115 | 1 | 1100111000 | — | A07 | A08 | B43 | — | B44 | C03 | — | C04 |
| x . | | . . . . . . . . . . | | | | | | | | | . x |
| 0124 | 1 | 0011111000 | — | A25 | A26 | B43 | — | B44 | C03 | — | C04 |
| 0125 | 2 | 1011111000 | A27 | — | A28 | B45 | B46 | — | C05 | C06 | — |
| 0126 | 0 | 0111111000 | A29 | A30 | — | — | B47 | B48 | — | C01 | C02 |
| 0127 | 1 | 1111111000 | — | A31 | A32 | B43 | — | B44 | C03 | — | C04 |
| 0128 | 2 | 0000000100 | — | A01 | A02 | — | B01 | B02 | C07 | C08 | — |

TABLE NO. 9-continued

| | | | | | | | | | | | |
|---|---|---|---|---|---|---|---|---|---|---|---|
| 0129 | 0 | 1000000100 | A03 | — | A04 | B03 | — | B04 | — | C09 | C10 |
| 0130 | 1 | 0100000100 | A05 | A06 | — | B05 | B06 | — | C11 | — | C12 |
| 0131 | 2 | 1100000100 | — | A07 | A08 | — | B01 | B02 | C07 | C08 | — |
| 0132 | 0 | 0010000100 | A09 | — | A10 | B03 | — | B04 | — | C09 | C10 |
| 0133 | 1 | 1010000100 | A11 | A12 | — | B05 | B06 | — | C11 | — | C12 |
| x. | | ............ | .... | .... | .... | .... | .... | .... | .... | .... | .x |
| 0142 | 1 | 0111000100 | A29 | A30 | — | B05 | B06 | — | C11 | — | C12 |
| 0143 | 2 | 1111000100 | — | A31 | A32 | — | B01 | B02 | C07 | C08 | — |
| 0144 | 0 | 0000100100 | — | A01 | A02 | B07 | — | B08 | — | C09 | C10 |
| 0145 | 1 | 1000100100 | A03 | — | A04 | B09 | B10 | — | C11 | — | C12 |
| 0146 | 2 | 0100100100 | A05 | A06 | — | — | B11 | B12 | C07 | C08 | — |
| x. | | ............ | .... | .... | .... | .... | .... | .... | .... | .... | .x |
| 0159 | 0 | 1111100100 | — | A31 | A32 | B07 | — | B08 | — | C09 | C10 |
| x. | | ............ | .... | .... | .... | .... | .... | .... | .... | .... | .x |
| x. | | ............ | .... | .... | .... | .... | .... | .... | .... | .... | .x |
| 0240 | 0 | 0000111100 | — | A01 | A02 | B43 | — | B44 | — | C09 | C10 |
| x. | | ............ | .... | .... | .... | .... | .... | .... | .... | .... | .x |
| 0255 | 0 | 1111111100 | — | A31 | A32 | B43 | — | B44 | — | C09 | C10 |
| 0256 | 1 | 0000000010 | — | A01 | A02 | — | B01 | B02 | C13 | — | C14 |
| x. | | ............ | .... | .... | .... | .... | .... | .... | .... | .... | .x |
| 0271 | 1 | 1111000010 | — | A31 | A32 | — | B01 | B02 | C13 | C14 | — |
| 0272 | 2 | 0000100010 | — | A01 | A32 | B07 | — | B08 | C15 | C16 | — |
| x. | | ............ | .... | .... | .... | .... | .... | .... | .... | .... | .x |
| 0287 | 2 | 1111100010 | — | A31 | A32 | B07 | — | B08 | C15 | C16 | — |
| x. | | ............ | .... | .... | .... | .... | .... | .... | .... | .... | .x |
| x. | | ............ | .... | .... | .... | .... | .... | .... | .... | .... | .x |
| 0512 | 2 | 0000000001 | — | A01 | A02 | — | B01 | B02 | C25 | C26 | — |
| x. | | ............ | .... | .... | .... | .... | .... | .... | .... | .... | .x |
| 0527 | 2 | 1111000001 | — | A31 | A32 | — | B01 | B02 | C25 | C26 | — |
| 0528 | 0 | 0000100001 | — | A01 | A02 | B07 | — | B08 | — | C27 | C28 |
| x. | | ............ | .... | .... | .... | .... | .... | .... | .... | .... | .x |
| 0543 | 0 | 1111100001 | — | A31 | A32 | B07 | — | B08 | — | C27 | C28 |
| x. | | ............ | .... | .... | .... | .... | .... | .... | .... | .... | .x |
| x. | | ............ | .... | .... | .... | .... | .... | .... | .... | .... | .. |
| 0704 | 2 | 0000001101 | — | A01 | A02 | B25 | — | B26 | C33 | C34 | — |
| x. | | ............ | .... | .... | .... | .... | .... | .... | .... | .... | .x |
| 0719 | 2 | 1111001101 | — | A31 | A32 | B25 | — | B26 | C33 | C34 | — |
| 0720 | 0 | 0000101101 | — | A01 | A02 | B31 | B32 | — | — | C35 | C36 |
| x. | | ............ | .... | .... | .... | .... | .... | .... | .... | .... | .x |
| 0735 | 0 | 1111101101 | — | A31 | A32 | B31 | B32 | — | — | C35 | C36 |
| 0736 | 1 | 0000011101 | — | A01 | A02 | — | B37 | B38 | C31 | C32 | — |
| x. | | ............ | .... | .... | .... | .... | .... | .... | .... | .... | .x |
| 0751 | 1 | 1111011101 | — | A31 | A32 | — | B37 | B38 | C31 | C32 | — |
| x. | | ............ | .... | .... | .... | .... | .... | .... | .... | .... | .x |
| x. | | ............ | .... | .... | .... | .... | .... | .... | .... | .... | .x |
| 0976 | 1 | 0000101111 | — | A01 | A02 | B31 | B32 | — | C47 | — | C48 |
| x. | | ............ | .... | .... | .... | .... | .... | .... | .... | .... | .x |
| 0991 | 1 | 1111101111 | — | A31 | A32 | B31 | B32 | — | C47 | — | C48 |
| 0992 | 2 | 0000011111 | — | A01 | A02 | — | B37 | B38 | C43 | C44 | — |
| x. | | ............ | .... | .... | .... | .... | .... | .... | .... | .... | .x |
| 1007 | 2 | 1111011111 | — | A31 | A32 | — | B37 | B38 | C43 | C44 | — |
| 1008 | 0 | 0000111111 | — | A01 | A02 | B43 | — | B44 | — | C45 | C46 |
| 1009 | 1 | 1000111111 | A03 | — | A04 | B45 | B46 | — | C47 | — | C48 |
| 1010 | 2 | 0100111111 | A05 | A06 | — | — | B47 | B48 | C43 | C44 | — |
| 1011 | 0 | 1100111111 | — | A07 | A08 | B43 | — | B44 | — | C45 | C46 |
| x. | | ............ | .... | .... | .... | .... | .... | .... | .... | .... | .x |
| 1019 | 2 | 1101111111 | A23 | A24 | — | — | B47 | B48 | C43 | C44 | — |
| 1020 | 0 | 0011111111 | — | A25 | A26 | B43 | — | B44 | — | C45 | C46 |
| 1021 | 1 | 1011111111 | A27 | — | A28 | B45 | B46 | — | C47 | — | C48 |
| 1022 | 2 | 0111111111 | A29 | A30 | — | — | B47 | B48 | C43 | C44 | — |
| 1023 | 0 | 1111111111 | — | A31 | A32 | B43 | — | B44 | — | C45 | C46 |
| 1024 | 1 | 0000000000 | — | A01 | A02 | — | B01 | B02 | — | C01 | C02 |

TABLE NO. 10

| MODULE NO. | INPUTS 111 RRD 012 | 222 RRR 012 | 333 RRR 012 | 444 RRR 012 | Circuit Path Elements |
|---|---|---|---|---|---|
| 8 | 100 | 010 | 001 | 100 | 411A-421B-432C-441A-452 |
| | | | | | 411A-421B-432C-442A-453 |
| 9, 10 ea. | 100 | 100 | 100 | 100 | 411A-421A-431A-441A-452 |
| | | | | | 411A-421A-431A-442A-453 |

We claim:

1. Circuit apparatus responsive to a digital input signal indicative of a multiple bit number, said apparatus in response to said input signal providing a digital output signal indicative of the modulus-N residue of said input signal, where N is a predetermined odd integer greater than one, said apparatus comprising:
   a current source,
   an array of multiple modular groups, each said group having plural series-connected successive banks of plural semiconductor current switches, said switches of said banks of each said group having a predetermined cascode current logic tree network configuration, each of said banks having predetermined signal responsive control means for controlling said switches of the particular said bank thereof, said control means of each one of said series-connected banks of the same group having a different response level with respect to the respective response levels of the other control means of the other banks of said same group, said array further having N output circuit paths, said input signal being received by predetermined ones of said control means of predetermined ones of said groups of said array, and in response to said input signal at said predetermined ones of said control means said switches of said array coact to selectively connect said circuit paths to said current source to provide a current condition in said circuit paths indicative of the numerical value of said modulus-N residue that is associated with the value of the number of said input signal present at said predetermined ones of said control means, and output means coupled to said circuit paths to provide said output signal thereat in accordance with said current condition of said paths.

2. Circuit apparatus according to claim 1 wherein each of said modular groups has the same plural number B of banks, and each of said modular groups has N outputs.

3. Circuit apparatus according to claim 2 wherein said multiple bit number has D bits and said input signal has a corresponding number D of data bit signals.

4. Circuit apparatus according to claim 3 wherein said array comprises:

a predetermined one first modular group of said modular groups adapted to receive B predetermined mutually exclusive predetermined ones of said data bit signals at its said control means of each of its said banks, the remaining said modular groups being arranged in said array in succession after said first modular group, each of said remaining modular groups being adapted to receive in said succession predetermined B−1 mutually exclusive others of said data bit signals at its said control means of B−1 predetermined said banks thereof, the control means of the remaining one of said B banks of each of said modular groups being coupled to said N outputs of the preceding remaining modular group of said succession, and said output means further comprising said N outputs of the last modular group of said succession of said array.

5. Circuit apparatus according to claim 3 wherein said array comprises:

each of predetermined first ones of said modular groups adapted to receive B predetermined mutually exclusive ones of said data bit signals, each of said first ones of said groups providing a residue signal at its respective outputs indicative of the residue value of the data bits received at its said inputs, and at least one other predetermined second group of said modular groups having a predetermined number of its said input means of its series-connected B banks coupled to said outputs of a corresponding number of said ones of said first groups to provide at its said output a composite residue signal of said data bit signals received by the particular said ones of said first groups with their said outputs coupled to said inputs of said second group.

6. Circuit apparatus responsive to a digital input signal indicative of a multiple bit number, said apparatus in response to said input signal providing a digital output signal indicative of the modulus-3 residue of said input signal, said apparatus comprising:

a current source, an array of multiple modular groups, each said group having plural series-connected successive banks of plural semiconductor current switches, said switches of said banks of each said group having a predetermined cascode current logic tree network configuration, each of said banks having predetermined signal responsive control means for controlling said switches of the particular said bank thereof, said control means of each one of said series-connected banks of the same group having a different response level with respect to the respective response levels of the other control means of the other banks of said same group, said array further having 3 circuit paths, said input signal being received by predetermined ones of said control means of predetermined ones of said groups of said array, and in response to said input signal at said predetermined ones of said control means said switches of said array coact to selectively connect said circuit paths to said current source to provide a current condition in said circuit paths indicative of the numerical value of said modulus-3 residue that is associated with the value of the number of said input signal present at said predetermined ones of said control means, and output means coupled to said circuit paths to provide said output signal thereat in accordance with said current condition of said paths.

7. Circuit apparatus according to claim 6 wherein each of said modular groups has the same plural number of banks, and each of said modular groups has three outputs.

8. Circuit apparatus according to claim 7 wherein each of said modular groups has four said banks.

9. Circuit apparatus according to claim 8 wherein said multiple bit number has at least five bits and said input signal has a corresponding number of data bit signals.

10. Circuit apparatus according to claim 9 wherein said array comprises:

a predetermined one first modular group of said modular groups adapted to receive a predetermined mutually exclusive one of the low order bits of the first four bits of said data bit signals at its said control means of each of its said four banks, the remaining said modular groups being arranged in said array in succession after said first modular group, each of said remaining modular groups being adapted to receive in said succession mutually exclusive three consecutive higher order bits of said data bit signals at its said control means of predetermined three consecutively series-connected banks, respectively, of its four said series-connected banks, the control means of the remaining one of said four banks of each of said remaining modular groups being coupled to said three outputs of the preceding modular group of said succession, and said output means further comprising said three outputs of the last modular group of said succession of said array.

11. Circuit apparatus according to claim 9 wherein said array comprises:

each of predetermined first ones of said modular groups adapted to receive predetermined mutually exclusive four consecutive order bits of said data bit signals, said four bit data bit signals of each of said four consecutive order bits being mutually exclusively applied in consecutive order to said control means of said consecutively series-connected four banks, respectively, of the group receiving the particular said four data bit signals, each of said ones of said first groups providing a residue signal at its respective outputs indicative of the residue value of the data bits received at its said inputs, and at least one other predetermined second group of said modular groups having a predetermined number of its said input means of its series-connected four banks coupled to said outputs of a corresponding number of said ones of said first groups to provide at its said output a composite residue signal of said data bit signals received by the particular said ones of said first groups with their said outputs coupled to said inputs of said second group.

* * * * *